United States Patent
Sonoda et al.

(10) Patent No.: US 9,748,526 B2
(45) Date of Patent: Aug. 29, 2017

(54) VAPOR DEPOSITION DEVICE, VAPOR DEPOSITION METHOD, AND METHOD FOR PRODUCING ORGANIC EL DISPLAY DEVICE

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 992 days.

(21) Appl. No.: 14/004,896

(22) PCT Filed: Mar. 9, 2012

(86) PCT No.: PCT/JP2012/056127
§ 371 (c)(1),
(2), (4) Date: Sep. 12, 2013

(87) PCT Pub. No.: WO2012/124629
PCT Pub. Date: Sep. 20, 2012

(65) Prior Publication Data
US 2014/0004641 A1    Jan. 2, 2014

(30) Foreign Application Priority Data

Mar. 15, 2011  (JP) ................ 2011-057236

(51) Int. Cl.
*C23C 14/24* (2006.01)
*H01L 51/56* (2006.01)
(Continued)

(52) U.S. Cl.
CPC ......... *H01L 51/56* (2013.01); *C23C 14/042* (2013.01); *C23C 14/12* (2013.01); *C23C 14/243* (2013.01); *H05B 33/10* (2013.01)

(58) Field of Classification Search
CPC ................ C23C 14/243; C23C 14/246
(Continued)

(56) References Cited

U.S. PATENT DOCUMENTS 3,345,059 A * 10/1967 Swindt ............. C23C 14/243
                                                              264/30
4,897,290 A *  1/1990 Terasaka ........... C23C 14/24
                                                              118/726
(Continued)

FOREIGN PATENT DOCUMENTS

| JP | 08-227276 | 9/1996 |
|---|---|---|
| JP | 2000-188179 A | 7/2000 |
| JP | 2008-081778 A | 4/2008 |

OTHER PUBLICATIONS

International Search Report received for PCT Patent Application No. PCT/JP2012/056127, dated Jun. 12, 2012, 4 pages (2 pages of English Translation and 4 pages of ISR).

*Primary Examiner* — Gordon R Baldwin
*Assistant Examiner* — Aiden Lee
(74) *Attorney, Agent, or Firm* — Morrison & Foerster LLP

(57) ABSTRACT

A vapor deposition device (1) performs a vapor deposition treatment to form a luminescent layer (47) having a predetermined pattern on a film formation substrate (40). The vapor deposition device includes: a nozzle (13) having a plurality of injection holes (16) from which vapor deposition particles (17), which constitute the luminescent layer, are injected toward the film formation substrate when the vapor deposition treatment is carried out; and a plurality of control plates (20) provided between the nozzle and the film formation substrate and restricting an incident angle, with respect to the film formation substrate, of the vapor deposition particles injected from the plurality of injection holes. The nozzle includes: a nozzle main body (14*b*) in a container (Continued)

shape having an opening (14c) on a surface thereof on a film formation substrate side and (ii) a plurality of blocks (15) covering the opening and separated from each other, each of the plurality of blocks having the plurality of injection holes. The above arrangement allows a vapor-deposited film pattern to be formed with high definition.

15 Claims, 18 Drawing Sheets

(51) Int. Cl.
  *C23C 14/04* (2006.01)
  *C23C 14/12* (2006.01)
  *H05B 33/10* (2006.01)

(58) Field of Classification Search
  USPC .................................................. 118/726, 727
  See application file for complete search history.

(56) References Cited

U.S. PATENT DOCUMENTS

| | | |
|---|---|---|
| 5,742,129 A | 4/1998 | Nagayama et al. |
| 6,294,892 B1 | 9/2001 | Utsugi et al. |
| 2004/0056244 A1* | 3/2004 | Marcus ............... C23C 14/12 257/40 |
| 2005/0257745 A1* | 11/2005 | Abiko ............... C23C 14/243 118/726 |
| 2009/0017192 A1* | 1/2009 | Matsuura ............ C23C 14/042 427/66 |
| 2009/0061084 A1* | 3/2009 | Onuma ............... C23C 14/243 427/248.1 |
| 2009/0087545 A1* | 4/2009 | Ohmi ................. C23C 14/12 427/66 |
| 2010/0080901 A1* | 4/2010 | Hein .................. B01B 1/005 427/255.6 |
| 2010/0081104 A1* | 4/2010 | Hein .................. B01B 1/005 432/13 |
| 2010/0092665 A1 | 4/2010 | Sudou et al. |

* cited by examiner

VAPOR DEPOSITION DEVICE, VAPOR DEPOSITION METHOD, AND METHOD FOR PRODUCING ORGANIC EL DISPLAY DEVICE

CROSS REFERENCE TO RELATED APPLICATIONS

This is a U.S. National Phase patent application of PCT/JP2012/056127, filed Mar. 9, 2012, which claims priority to Japanese patent application no. 2011-057236, filed Mar. 15, 2011, each of which is hereby incorporated by reference in the present disclosure in its entirety.

TECHNICAL FIELD

The present invention relates to a vapor deposition device, a vapor deposition method, and a method for manufacturing an organic EL display device.

BACKGROUND ART

Recent years have witnessed development of various types of flat-panel displays (hereinafter referred to as "FPD").

In particular, an organic electroluminescence (EL) display device has been highly expected as an excellent FPD in terms of low power consumption and high-speed response, since it is capable of displaying an image by causing a luminescent layer, which is formed for each pixel, to self-emit light.

A pixel of an organic EL display device is typically constituted by a sub-pixel for a red (R) color including a luminescent layer that emits red light, a sub-pixel for a green (G) color including a luminescent layer that emits green light, and a sub-pixel for a blue (B) color including a luminescent layer that emits blue light. A luminescent layer provided in each pixel is a laminate of organic films. A pattern of a luminescent layer is formed for each sub-pixel.

As disclosed in Patent Literatures 1 and 2, a luminescent layer for each color is formed for each sub-pixel without causing color mixture, for example, by a deposition method with use of a mask (may also be called "shadow mask").

In Patent Literatures 1 and 2, a pattern of a luminescent layer is formed for each sub-pixel by sequentially moving a mask and a substrate relative to each other.

A vapor deposition source and a mask are typically spaced apart from each other. As such, not only vapor deposition particles which enter an opening of the mask in a direction perpendicular to the opening, but also vapor deposition particles which enter the opening in a direction oblique to the opening are deposited onto the substrate.

In the case where the vapor deposition particles which enter the opening in the direction oblique to the opening are deposited onto the substrate, blurring, in which a thickness of the luminescent layer is gradually reduced toward an edge of the luminescent layer, is formed in an edge section of the luminescent layer. The formation of the blurred part causes deterioration, such as color mixture, in image display properties.

In view of the circumstance, a new deposition method (hereinafter referred to as "novel deposition method") which can solve the above problem has been proposed. This is described with reference to FIG. 17.

FIG. 17 is a perspective view illustrating an arrangement of a vapor deposition device of the novel deposition method.

As illustrated in FIG. 17, (i) a vapor deposition source 160, (ii) a plurality of control plates 181, (iii) a mask 170, and (iv) a substrate 110 are provided in a hermetically-sealed vacuum chamber in this order in a Z axis direction so as to be spaced apart from one another.

The substrate 110 is moved (scanned) at a constant speed in a direction indicated by an arrow 110a in FIG. 17 while being spaced apart, by a predetermined distance, from the mask 170 which is parallel to the substrate 110. By carrying out deposition while moving the substrate 110 in this manner, it becomes possible to reduce a size of the mask 170 and thus prevent bending of the mask 170. The direction in which the substrate 110 is moved is a Y direction.

The mask 170 has a plurality of openings 171, a length direction of each of which corresponds to the Y direction. The openings 171 are formed in the mask 170 so as to be arranged in order along an X direction. The width of the mask 170 along the Y direction is smaller than the width of the substrate 110 along the Y direction.

Each of the control plates 181 has a main surface (surface having the largest area), which is parallel to a Y-Z plane. That is, each of the plurality of control plates 181 is perpendicular to the substrate 110. The plurality of control plates 181 are parallel to one another, and are arranged in order along the X direction.

The vapor deposition source 160 is provided so that a length direction of the vapor deposition source 160 corresponds to the X direction. The vapor deposition source 160 includes a plurality of nozzles 161 which are arranged in a row along the X direction.

Vapor deposition particles 191 injected from the nozzles 161 pass through between the control plates 181, and are transmitted through the openings 171 of the mask 170 so as to be deposited onto the substrate 110 which is being scanned. Providing the control plates 181 thus makes it possible to restrict oblique movement of the vapor deposition particles injected from the nozzles 161. That is, the provision of the control plates 181 makes it possible to restrict an incident angle of the vapor deposition particles entering the openings 171 of the mask 170. This makes it possible to suppress blurring of the luminescent layer deposited on the substrate 110.

CITATION LIST

Patent Literatures

Patent Literature 1
Japanese Patent Application Publication, Tokukaihei, No. 8-227276 A (Publication Date: Sep. 3, 1996)
Patent Literature 2
Japanese Patent Application Publication, Tokukai, No. 2000-188179 A (Publication Date: Jul. 4, 2000)

SUMMARY OF INVENTION

Technical Problem

However, the inventors of the present invention found that the technique illustrated in FIG. 17 has the following problem.

According to the vapor deposition device illustrated in FIG. 17, X direction movement the vapor deposition particles 191 injected from the nozzles 161 is restricted by the control plates 181.

As such, as illustrated in (a) and (b) of FIG. 18, a change in respective positions between the nozzles 161 and the control plates 181 relative to each other in the X direction results in a change in range of vapor deposition carried out with respect to the substrate 110. That is, it is important to minimize a change in respective positions between the nozzles 161 and the control plates 181 relative to each other.

(a) of FIG. 18 is a view illustrating a range of vapor deposition carried out by the vapor deposition source 160 before the vapor deposition source 160 is heated. (b) of FIG. 18 is a view illustrating a range of vapor deposition carried out by the vapor deposition source 160 after the vapor deposition source 160 is heated.

However, during the vapor deposition, an inside of the chamber of the vapor deposition device is heated to high temperature, so that the vapor deposition source 160 is extended by heat.

FIG. 19 is a view illustrating states of the vapor deposition source 160 before and after the vapor deposition source 160 is heated. As illustrated in FIG. 19, positions of the nozzles 161 change in accordance with the extension of the vapor deposition source 160. Misalignment of the nozzles 161 caused by heating is greater toward an end of the vapor deposition source 160.

An extension ΔL of the vapor deposition source 160 caused by heating can be expressed by the following formula where L is, as illustrated in FIG. 19, a length of the vapor deposition source 160 before being heated, a is a linear expansion coefficient of the vapor deposition source 160, and ΔT is an increase in temperature.

$$\Delta L = \alpha \times L \times \Delta T$$

This shows that the misalignment of the nozzles 161 is greater as L increases.

On the other hand, the control plates 181 are spaced apart from the vapor deposition source 160, and have a shape significantly different from that of the vapor deposition source 160. Accordingly, a position of a control plate 181 relative to a position of a nozzle 161 significantly changes before and after the heating, depending on the location.

Further, a heating temperature varies depending on a vapor deposition material used, and an amount of misalignment between the nozzles 161 and the control plates 181 is minute. This makes it difficult to correct in advance the amount of misalignment which is caused during the heating.

However, even though the misalignment between the nozzles 161 and the control plates 181 caused during the heating is minute, simply carrying out the vapor deposition causes a range of vapor deposition carried out with respect to the substrate 110 to vary depending on the location. This causes variations in position and shape of a deposited pattern, thereby causing degradation, such as color mixture, in image display property.

The present invention is accomplished in view of the problems. An object of the present invention is to form a vapor-deposited film pattern with high resolution.

Solution to Problem

In order to achieve the object, a vapor deposition device of the present invention is a vapor deposition device for performing a vapor deposition treatment so as to form a vapor-deposited film having a predetermined pattern on a film formation substrate, including: an injection section having a plurality of injection holes from which vapor deposition particles are injected toward the film formation substrate when the vapor deposition treatment is carried out, the vapor deposition particles constituting the vapor-deposited film; and a plurality of control plates for restricting an incident angle, with respect to the film formation substrate, of the vapor deposition particles injected from the plurality of injection holes, the plurality of control plates being provided between the injection section and the film formation substrate, the injection section including (i) an injection section main body in a container shape, the injection section main body having at least one opening on a surface, on a film formation substrate side, of the injection section main body and (ii) a plurality of blocks which cover the at least one opening and are separated from each other, each of the plurality of blocks having the plurality of injection holes.

According to the arrangement, the incident angle, with respect to the film formation substrate, of the vapor deposition particles injected from the injection holes can be restricted to a certain range with use of the plurality of control plates provided between the injection section and the film formation substrate. This makes it possible to prevent the vapor deposition particles from flying orthogonally onto the film formation substrate. Accordingly, it is possible to prevent unnecessary adhesion of a vapor-deposited film onto a side section of the predetermined vapor deposition pattern. This makes it possible to form a vapor-deposited film pattern with high definition.

Further, according to the arrangement, (i) the plurality of injection holes are formed in each of the plurality of blocks, which cover the at least one opening of the injection section main body and are provided separately from the injection section main body, and the plurality of blocks are separated from one another.

Accordingly, in a case where the plurality of blocks are heated when the vapor deposition treatment is carried out, the plurality of blocks extend independently of each other. This makes it possible to reduce misalignment of the plurality of injection holes before and after the heating as compared with a case where a single long block is formed integrally with an injection section main body.

This makes it possible to suppress occurrence of misalignment between (i) each of the plurality of control plates and (ii) a corresponding one of the plurality of injection holes during heating. This allows a higher-definition pattern of the vapor-deposited film pattern to be formed on the film formation substrate.

In order to achieve the object, a vapor deposition method of the present invention is a vapor deposition method for performing a vapor deposition treatment so as to form a vapor-deposited film having a predetermined pattern on a film formation substrate, the vapor deposition method comprising the step of: injecting, when the vapor deposition treatment is carried out, vapor deposition particles so that the vapor deposition particles (i) pass through between a plurality of control plates for restricting an incident angle, with respect to the film formation substrate, of the vapor deposition particles and (ii) then reach the film formation substrate, the vapor deposition particles constituting the vapor-deposited film pattern, the vapor deposition particles being injected from a plurality of injection holes, which are formed in each of a plurality of blocks separated from each other, in the step of injecting the vapor deposition particles.

According to the arrangement, when the vapor deposition particles reach the film formation substrate, an incident angle of the vapor deposition particles with respect to the film formation substrate is restricted by the control plates within a certain range. This makes it possible to prevent the vapor deposition particles from flying orthogonally onto the film formation substrate. Accordingly, it is possible to prevent unnecessary adhesion of a vapor-deposited film onto a side section of a predetermined vapor deposition pattern deposited onto the film formation substrate. This makes it possible to form a vapor-deposited film pattern with higher definition.

Further, in the step of injecting the vapor deposition particles, the vapor deposition particles are injected from the plurality of injection holes which are formed in each of the plurality of blocks separated from each other.

Accordingly, since the plurality of blocks extend independently of one another in a case where the plurality of blocks are heated during the vapor deposition treatment, it is possible to reduce misalignment of the plurality of injection holes before and after the heating, as compared with a case where a single long block is integrally formed.

This makes it possible to prevent occurrence of misalignment between (i) each of the plurality of control plates and (ii) a corresponding one of the plurality of injection holes during heating. This allows a vapor-deposited film pattern to be formed with higher definition on the film formation substrate.

Advantageous Effects of Invention

A vapor deposition device of the present invention is a vapor deposition device for performing a vapor deposition treatment so as to form a predetermined vapor-deposited film pattern on a film formation substrate, including: an injection section having a plurality of injection holes from which vapor deposition particles are injected toward the film formation substrate when the vapor deposition treatment is carried out, the vapor deposition particles constituting the vapor-deposited film pattern; and a plurality of control plates for restricting an incident angle, with respect to the film formation substrate, of the vapor deposition particles injected from the plurality of injection holes, the plurality of control plates being provided between the injection section and the film formation substrate, the injection section including (i) an injection section main body in a container shape, the injection section main body having at least one opening on a surface, on a film formation substrate side, of the injection section main body and (ii) a plurality of blocks which cover the at least one opening and are separated from each other, each of the plurality of blocks having the plurality of injection holes.

A vapor deposition method of the present invention is a vapor deposition method of the present invention is a vapor deposition method for performing a vapor deposition treatment so as to form a vapor-deposited film having a predetermined pattern on a film formation substrate, the vapor deposition method comprising the step of: injecting, when the vapor deposition treatment is carried out, vapor deposition particles so that the vapor deposition particles (i) pass through between a plurality of control plates for restricting an incident angle, with respect to the film formation substrate, of the vapor deposition particles and (ii) then reach the film formation substrate, the vapor deposition particles constituting the vapor-deposited film pattern, the vapor deposition particles being injected from a plurality of injection holes, which are formed in each of a plurality of blocks separated from each other, in the step of injecting the vapor deposition particles.

This allows a vapor-deposited film pattern to be formed with high definition.

Figure 5:
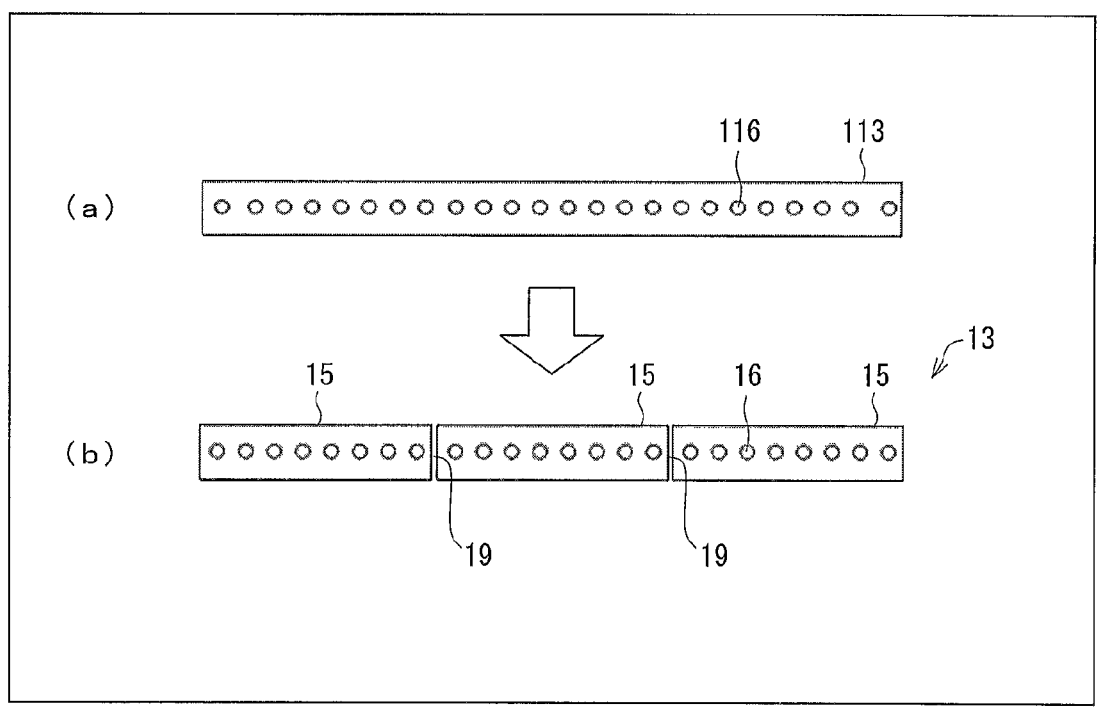

(a) of FIG. 5 is a plan view illustrating an arrangement of a conventional nozzle, and (b) of FIG. 5 is a plan view illustrating a nozzle in accordance with First Embodiment.

Figure 6:
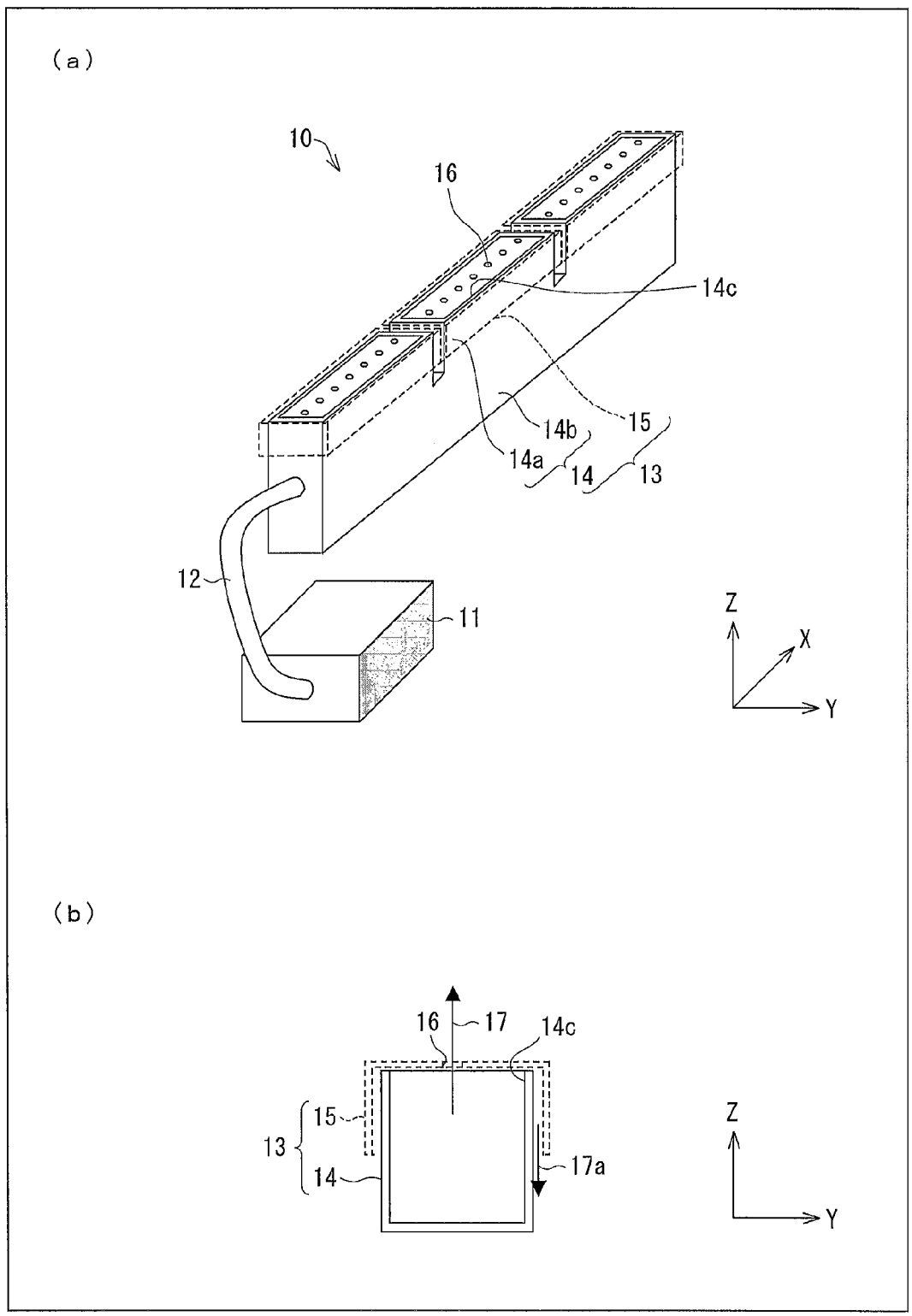

(a) of FIG. 6 is a perspective view illustrating an arrangement of the nozzle of First Embodiment, and (b) of FIG. 6 is a cross-sectional view of the nozzle illustrated in (a) of FIG. 6.

Figure 7:
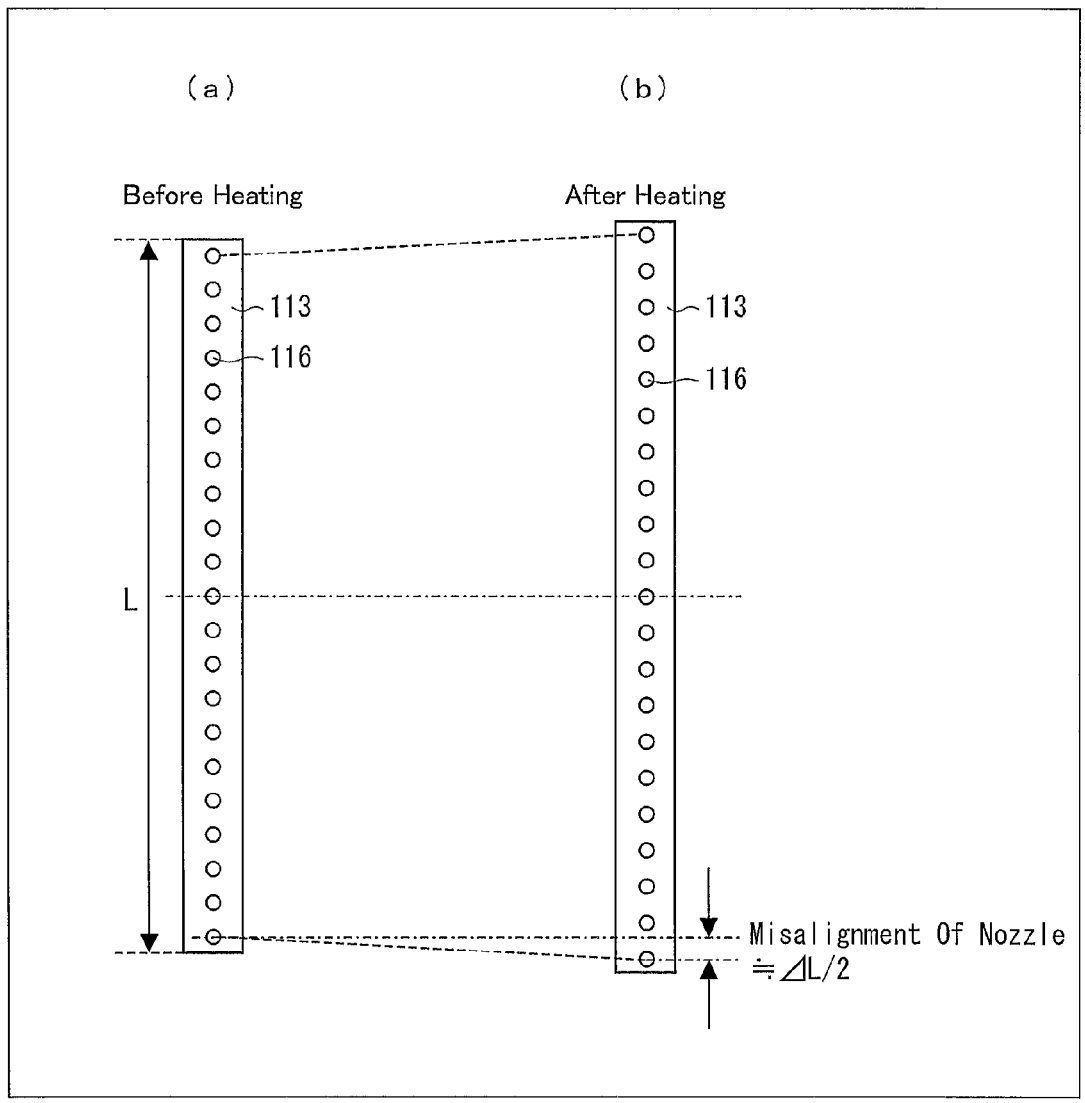

(a) of FIG. 7 is a plan view illustrating an arrangement of a conventional nozzle which has not been heated, and (b) of FIG. 7 is a plan view illustrating an arrangement of the conventional nozzle which has been heated.

Figure 8:
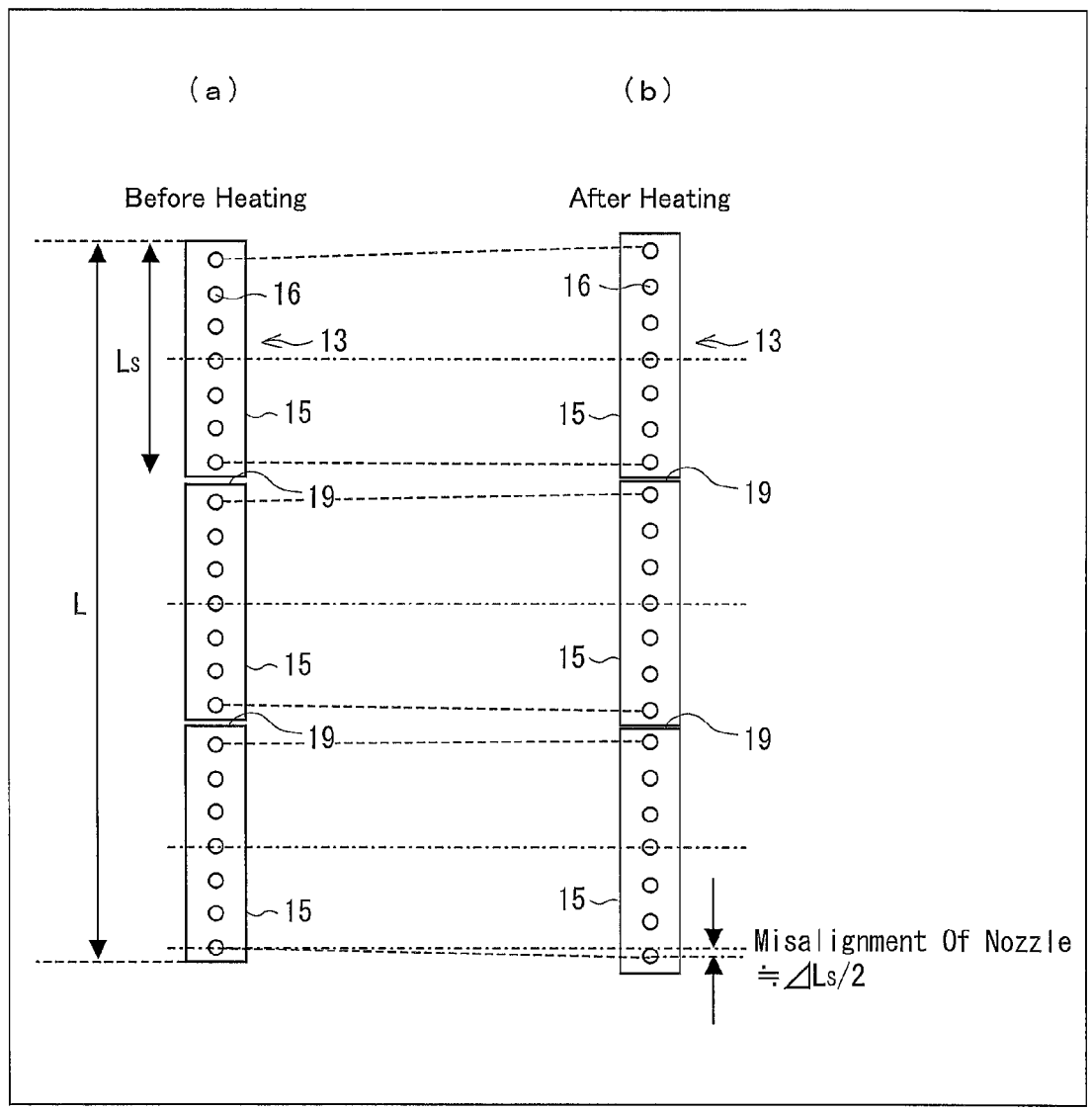

(a) of FIG. 8 is a plan view illustrating an arrangement of the nozzle of First Embodiment which has not been heated, and (b) of FIG. 8 is a plan view illustrating an arrangement of the nozzle of First Embodiment which has been heated.

Figure 9:
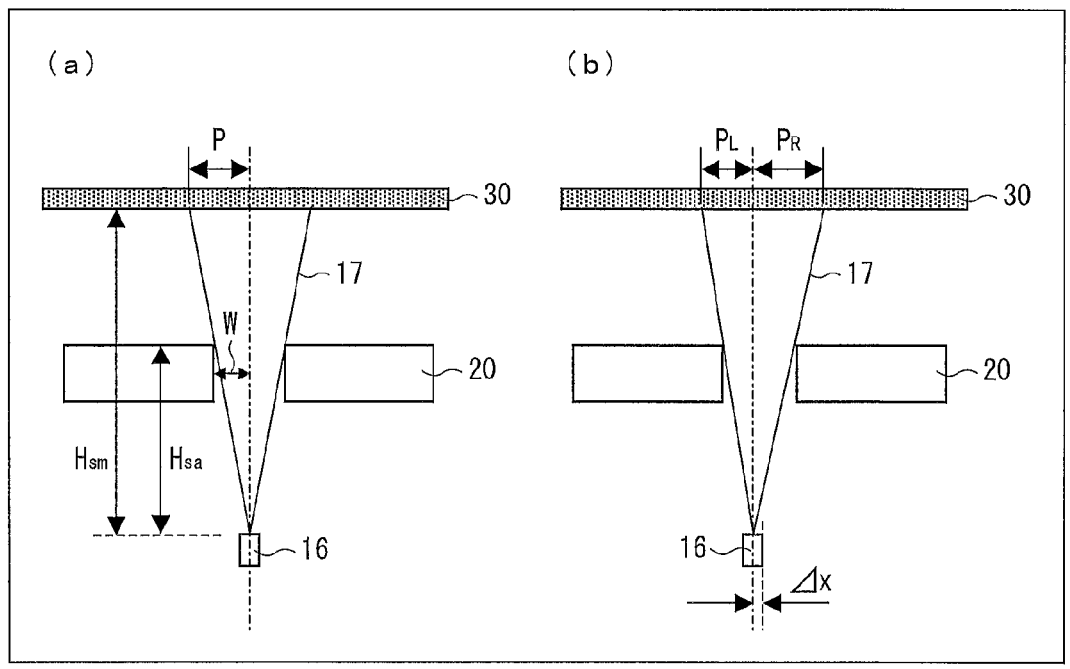

(a) of FIG. 9 is a view illustrating a range of vapor deposition range carried out in a case where an injection hole is not misaligned. (b) of FIG. 9 is a view illustrating a range of vapor deposition carried out in a case where the injection hole is misaligned.

Figure 10:
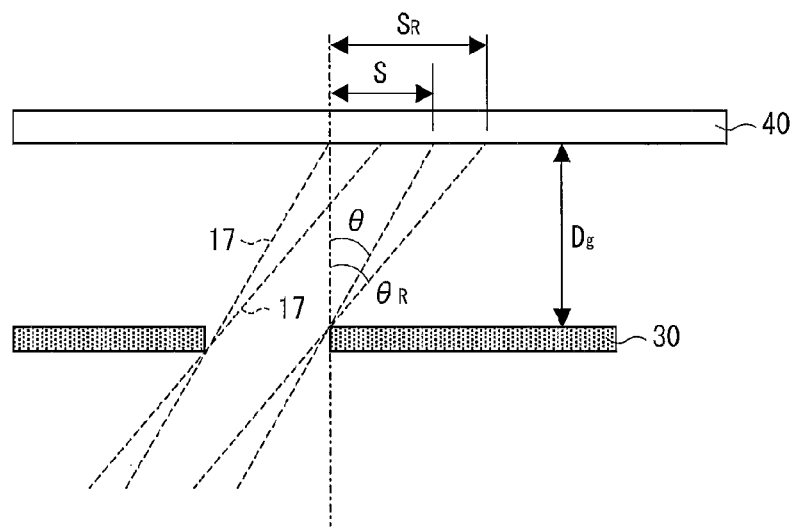

FIG. 10 is a view illustrating a change in position of a vapor-deposited film pattern formed on the film formation substrate, which change is caused by misalignment of an injection hole.

Figure 11:
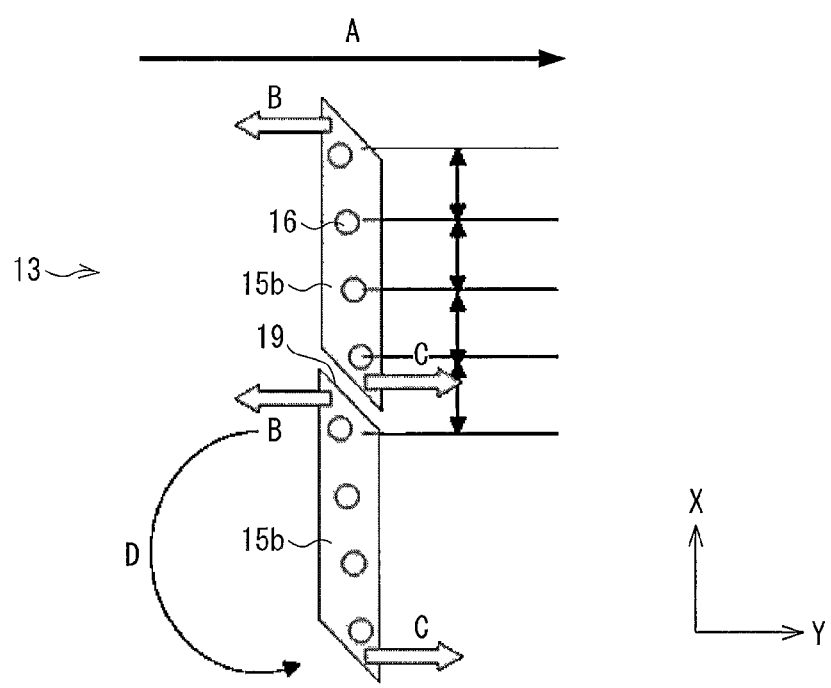

FIG. 11 is a plan view illustrating an arrangement of a nozzle including a plurality of blocks each having a parallelogram shape in a plan view.

Figure 12:
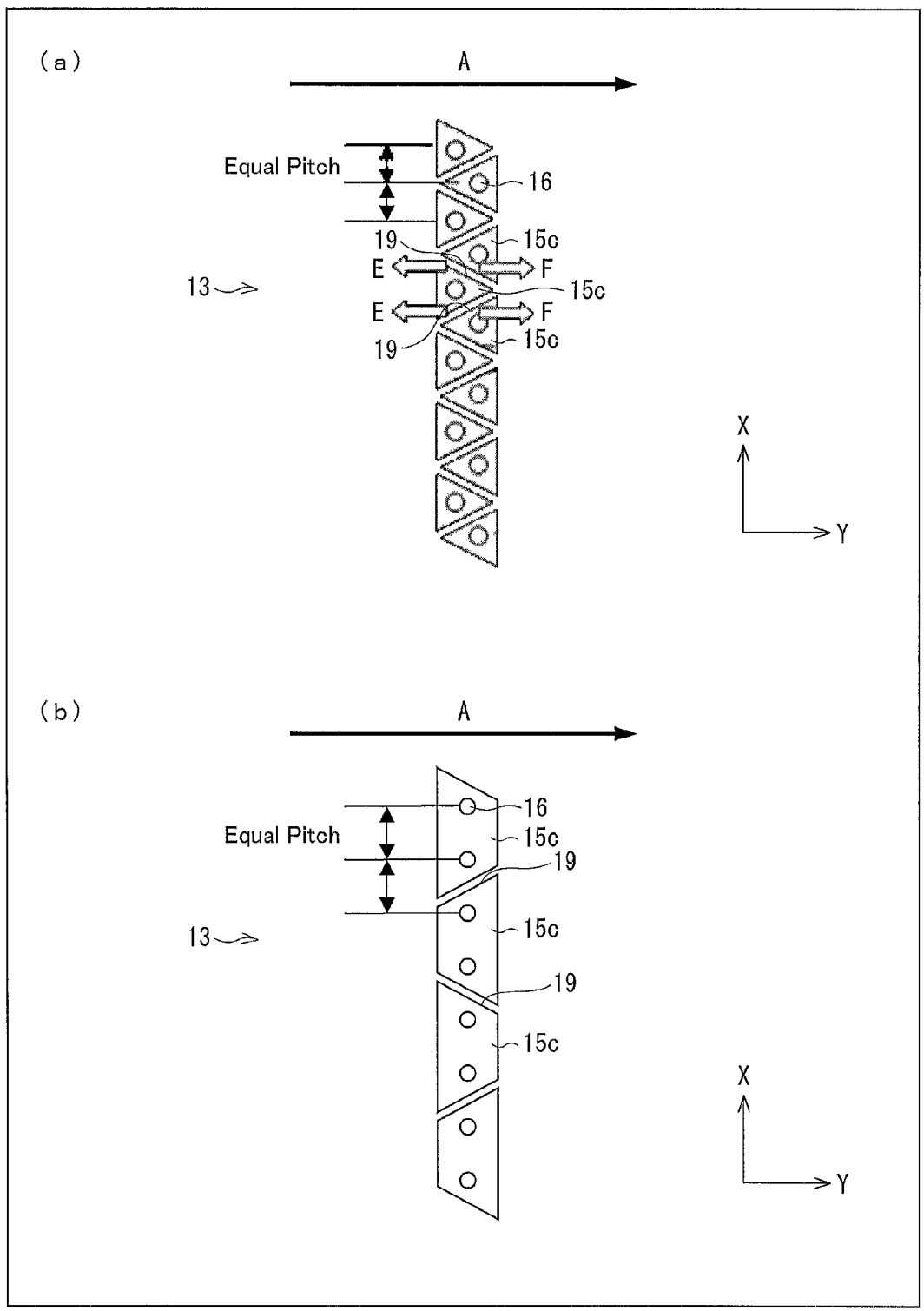

FIG. 12 shows plan views each illustrating an arrangement of a nozzle including a plurality of blocks in a plan view. (a) of FIG. 12 is a plan view illustrating blocks each having a triangular shape. (b) of FIG. 12 is a plan view illustrating blocks each having a trapezoidal shape.

Figure 13:
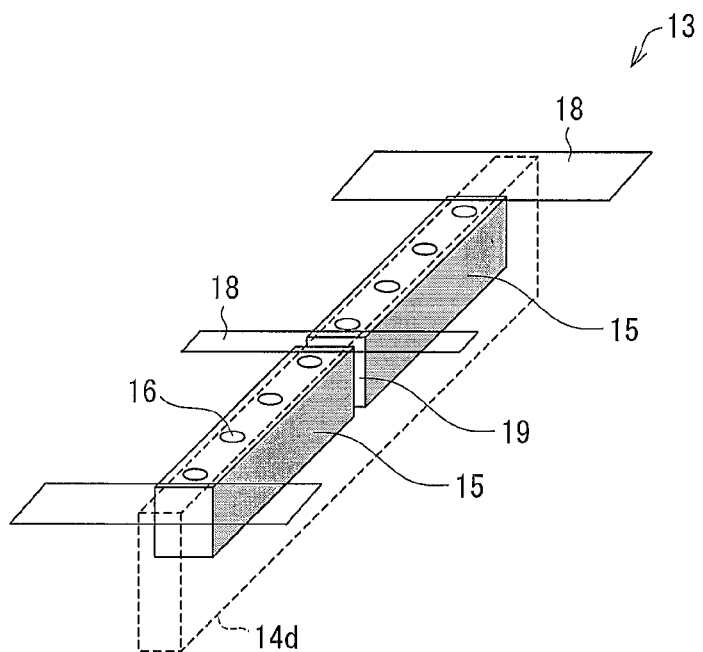

FIG. 13 is a perspective view illustrating a nozzle constituted by (i) a nozzle main body including no protruding section and (ii) a plurality of blocks.

Figure 14:
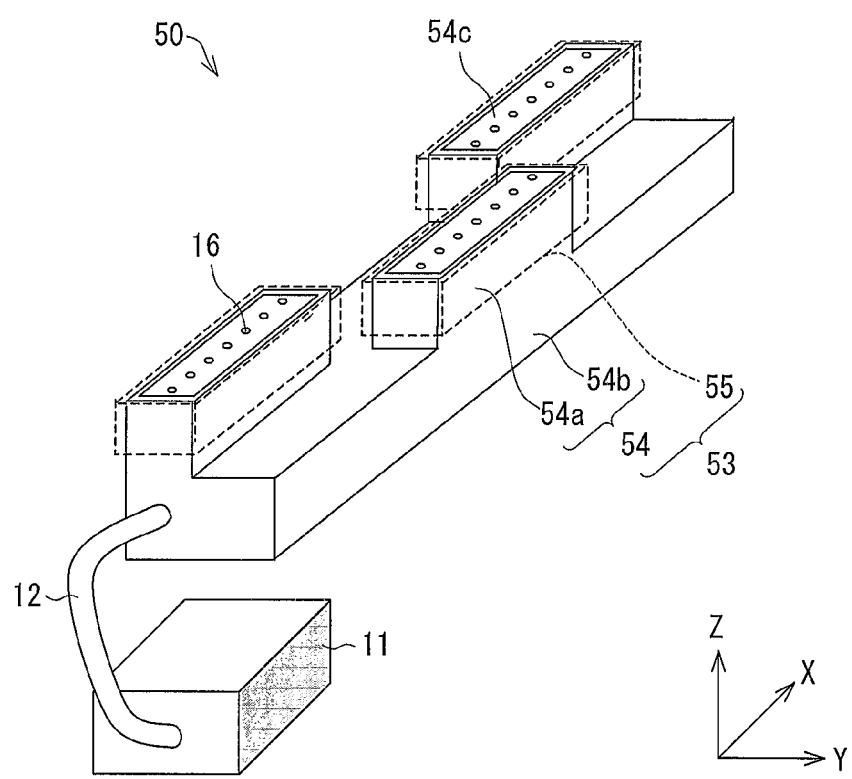

FIG. 14 is a perspective view illustrating an arrangement of a vapor deposition source in accordance with Second Embodiment.

Figure 15:
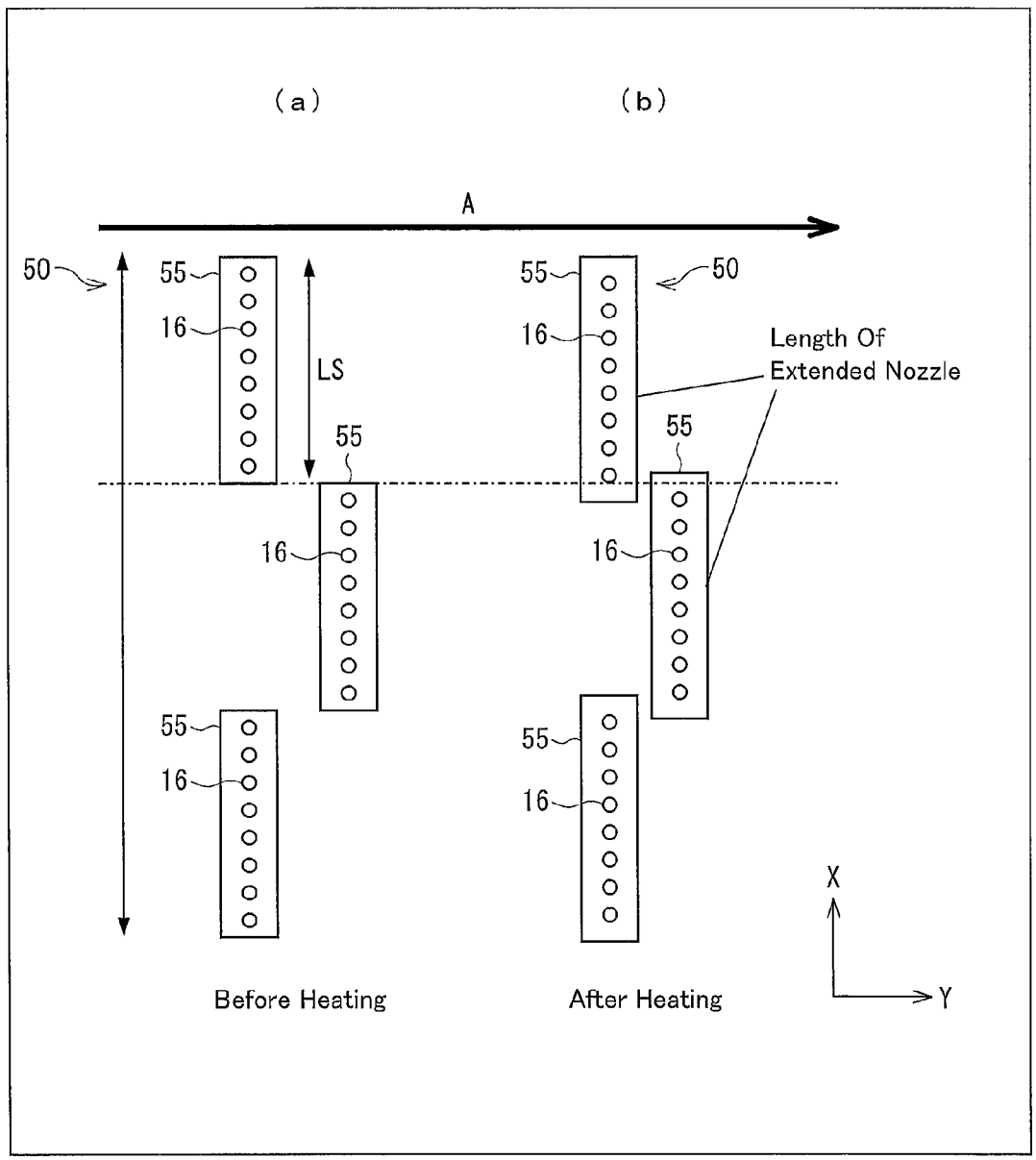

(a) and (b) of FIG. 15 illustrate blocks of a nozzle in accordance with Second Embodiment. (a) of FIG. 15 is a plan view illustrating the blocks which have not been heated, and (b) is a plan view illustrating the blocks which have been heated.

Figure 16:
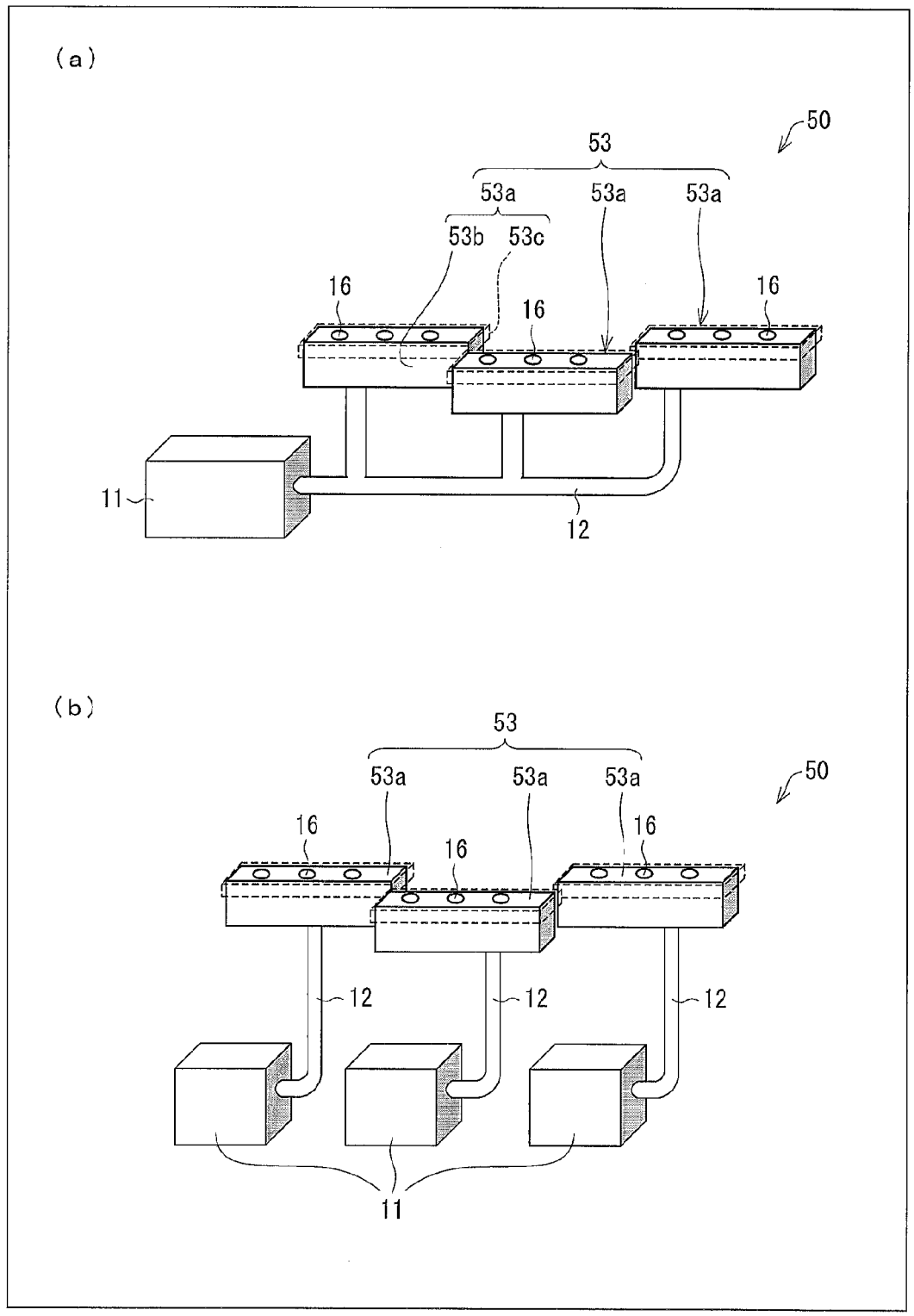

(a) and (b) of FIG. 16 illustrate modified examples of the vapor deposition source Second Embodiment. (a) of FIG. 16 is a view illustrating an arrangement of a vapor deposition source in which a single vapor deposition material supply source is connected with a plurality of divided nozzles. (b) of FIG. 16 is a view illustrating an arrangement of a vapor deposition source in which a plurality of vapor deposition material supply sources are connected with the respective plurality of divided nozzles.

Figure 17:
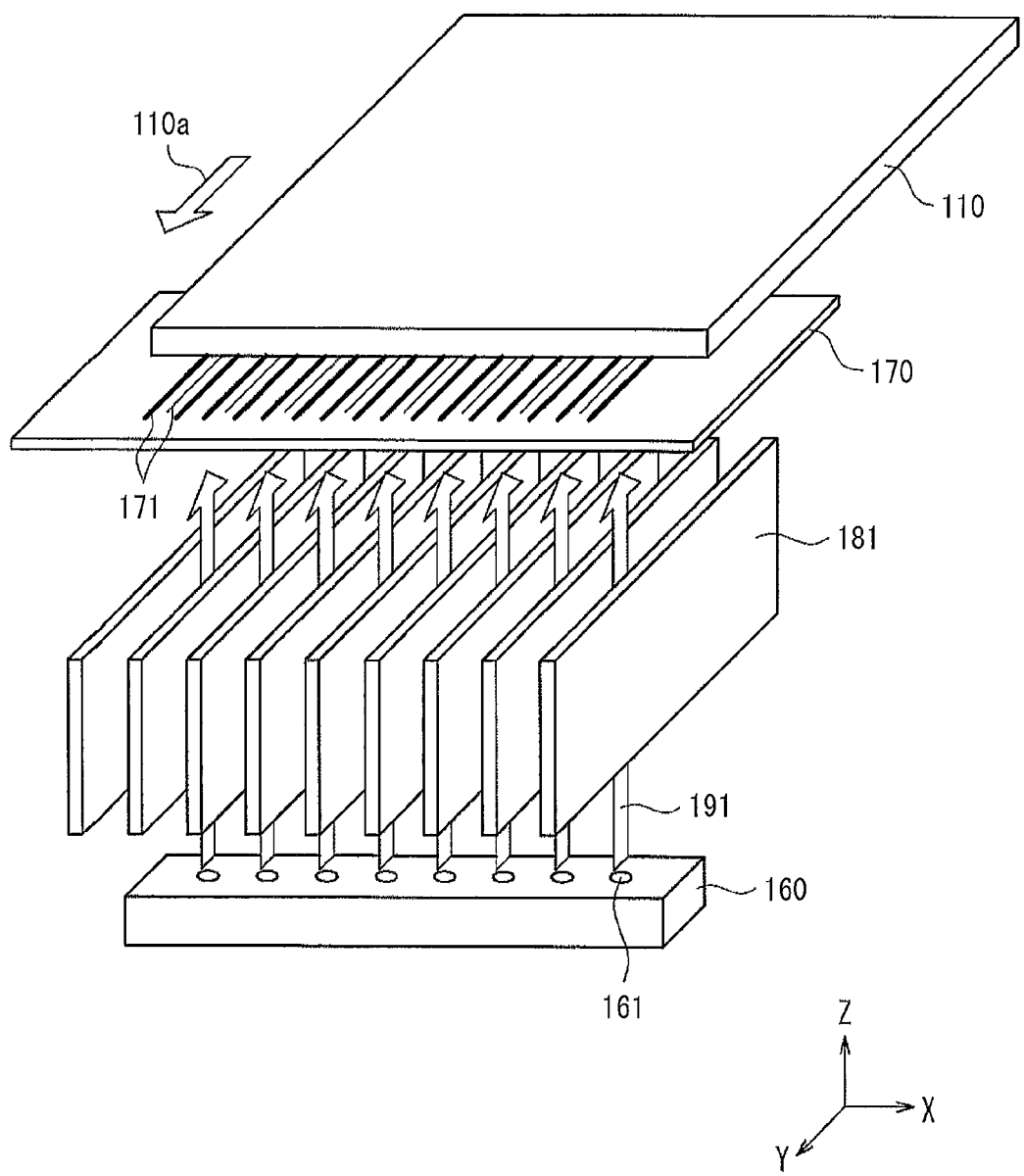

FIG. 17 is a perspective view illustrating an arrangement of a vapor deposition device of the novel deposition method.

Figure 18:
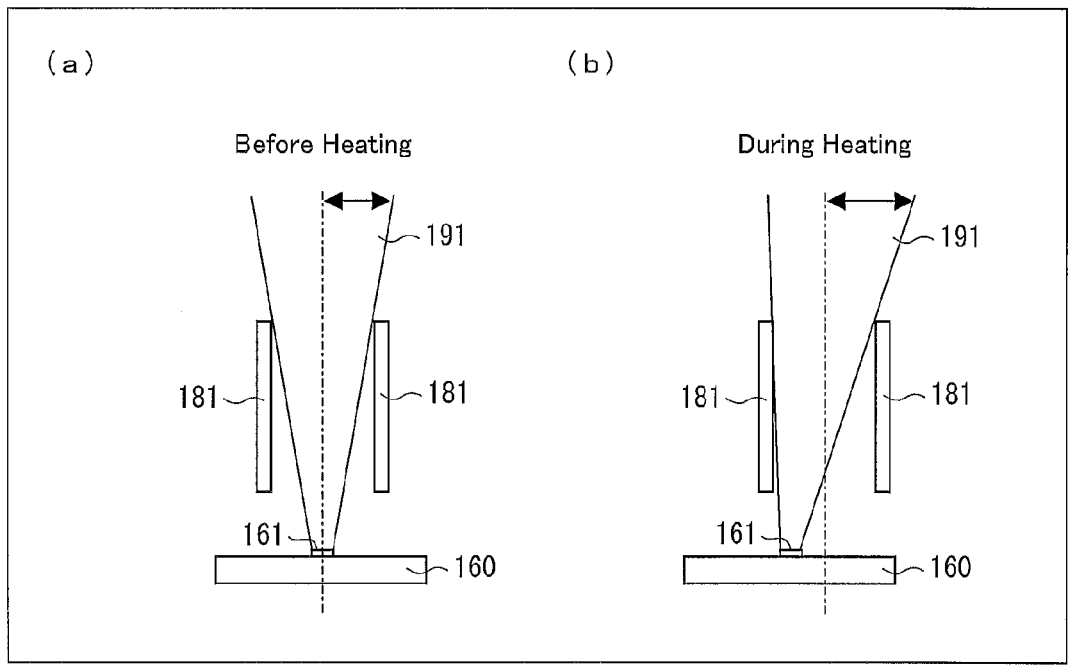

(a) of FIG. 18 is a view illustrating a range of vapor deposition carried out by the vapor deposition source of (a) of FIG. 17 before the vapor deposition source is heated. (b) of FIG. 18 is a view illustrating a range of vapor deposition carried out by the vapor deposition source of (a) of FIG. 17 after the vapor deposition source is heated.

Figure 19:
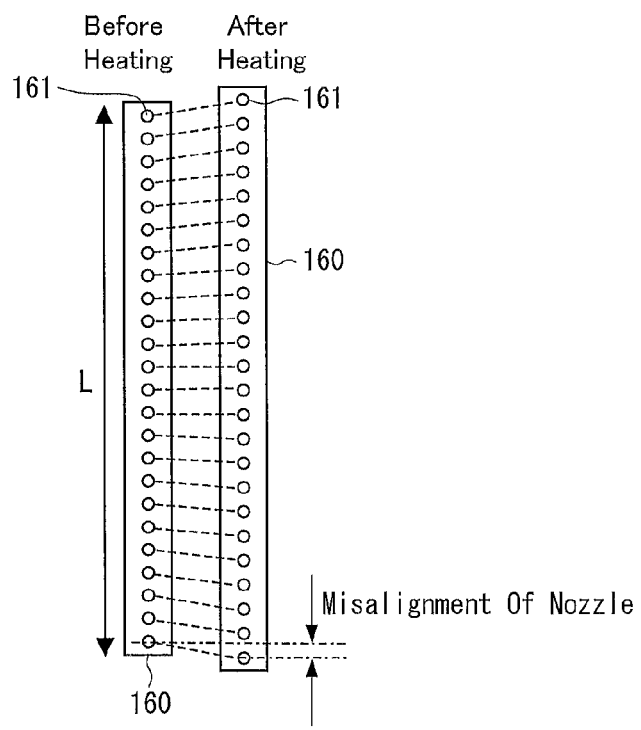

FIG. 19 is a view illustrating states of the vapor deposition source of FIG. 17 before and after the vapor deposition source is heated.

Figure 20:
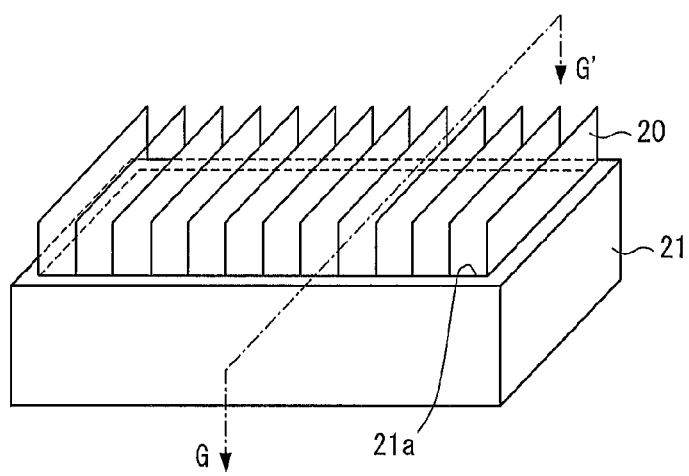
Figure 20:
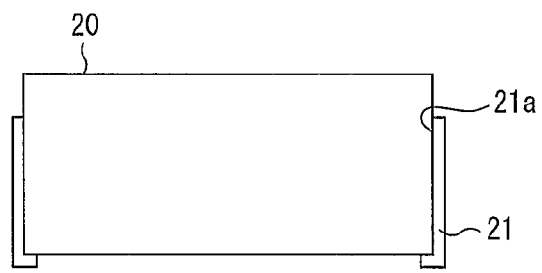

(a) of FIG. 20 is a perspective view illustrating a support for control plates. (b) of FIG. 20 is a cross-sectional view taken along a line G-G' in (a) of FIG. 20.

DESCRIPTION OF EMBODIMENTS

The following description will discuss in detail an embodiment of the present invention.

First Embodiment

First Embodiment of the present invention is described with reference to FIG. 1 through (a) and (b) of FIG. 12.

First, the following description will discuss (i) an arrangement of an organic EL display device manufactured with use of a vapor deposition device 1 in accordance with First Embodiment and (ii) a method for manufacturing the organic EL display device. Then, an arrangement of the vapor deposition device 1 will be described.

(Arrangement of Organic EL Display Device)

Figure 3:
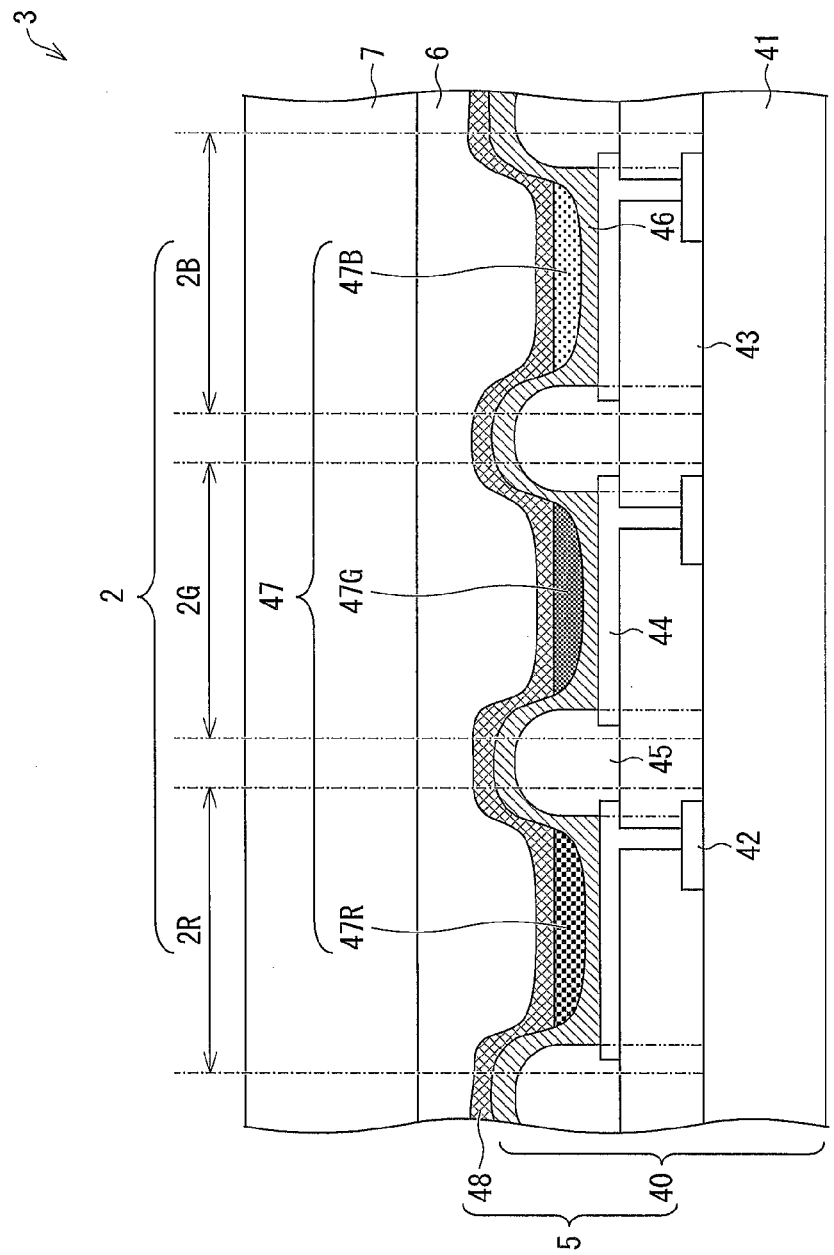
FIG. 3 is a cross-sectional view illustrating an arrangement of an organic EL display device.

An arrangement of an organic EL display device 3 manufactured with use of the vapor deposition device 1 will be described with reference to FIG. 3. FIG. 3 is a cross-sectional view illustrating an arrangement of the organic EL display device 3.

The organic EL display device 3 includes an organic EL substrate 5, an adhesive layer 6, and a sealing substrate 7. The organic EL display device 3 further includes an image control section (not shown) for controlling an image which is displayed. The organic EL substrate 5 and the sealing substrate 7 are attached to each other via the adhesive layer 6.

The organic EL substrate 5 includes a film formation substrate 40, luminescent layers 47, and a second electrode 48. In the organic EL display device 3, each pixel 2 is constituted by a sub-pixel 2R which emits red light, a sub-pixel 2G which emits green light, and a sub-pixel 2B which emits blue light. A plurality of pixels 2 are arranged in matrix in an image display region of the organic EL display device 3.

The luminescent layers 47 are made up of (i) a luminescent layer 47R which is provided in the sub-pixel 2R and emits red light, (ii) a luminescent layer 47G which is provided in the sub-pixel 2G and emits green light, and (iii) a luminescent layer 47B which is provided in the sub-pixel 2B and emits blue light.

As described later, the vapor deposition device 1 in accordance with the present embodiment can be used suitably as a vapor deposition device for sequentially forming the luminescent layers 47R, 47G, and 47B in the respective sub-pixels 2R, 2G, and 2B by selective vapor deposition.

The film formation substrate 40 includes a supporting substrate 41, TFTs 42, an interlayer insulating film 43, first electrodes 44, an edge cover 45, and a hole injection layer/hole transfer layer 46.

The supporting substrate 41 is made of, for example, glass. The supporting substrate 41 is provided with a plurality of gate lines (not shown) which are parallel to each other, and a plurality of signal lines (not shown) which are parallel to each other and orthogonally intersect with the gate lines. In a plan view of the display device 3, regions defined by the signal lines and the gate lines correspond to the respective sub-pixels 2R, 2G, and 2B.

The TFTs 42 are provided in the respective sub-pixels 2R, 2G, and 2B of the supporting substrate 41. The TFTs 42 are switching elements for control of driving the sub-pixels 2R, 2G, and 2B.

The interlayer insulating film 43 serves also as a planarizing film, and is formed throughout the entire display region of the supporting substrate 41 so as to cover the TFTs 42.

The first electrodes 44 each serve as an anode in the present embodiment. The first electrodes 44 are provided on the interlayer insulating film 43. The first electrodes 44 are provided in the respective sub-pixels 2R, 2G, and 2B so as to be each connected with a TFT 42 of a corresponding one of the sub-pixels 2R, 2G, and 2B via a contact hole provided in the interlayer insulating film 43.

The edge cover 45 is an insulating layer for preventing edge sections of the first electrodes 44 from short-circuiting with the second electrode 48 (described later). The edge cover 45 is provided on the interlayer insulating film 43 so as to cover the edge sections of the first electrodes 44.

The hole injection layer/hole transfer layer 46 serves as both a hole injection layer and a hole transfer layer. The hole injection layer has the function of increasing efficiency in injecting positive holes from the first electrodes 44 to the luminescent layers 47R, 47G, and 47B. The hole transfer layer has the function of increasing efficiency in transferring positive holes to the luminescent layers 47R, 47G, and 47B.

The hole injection layer/hole transfer layer 46 is formed uniformly throughout the entire display region so as to cover the first electrodes 44 and the edge cover 45.

Note that the hole injection layer/hole transfer layer 46 may be provided separately as a hole injection layer and a hole transfer layer, instead of being provided as a single layer.

The film formation substrate 40 is arranged in this way. The organic EL substrate 5 includes (i) the film formation substrate 40, (ii) the luminescent layers 47 formed with use of the vapor deposition device 1, and (iii) the second electrode 48.

The luminescent layers 47 are each a layer that has the function of emitting light by recombining (i) holes (positive holes) injected from the first electrodes 44 side with (ii) electrons injected from the second electrode 48 side. The luminescent layers 47 are a vapor-deposited film pattern which is formed with use of the vapor deposition device 1. The luminescent layers 47 are each formed on the hole injection layer/hole transfer layer 46 and in the opening, between portions of the edge cover 45, of a corresponding one of the sub-pixels 2R, 2G, and 2B.

The luminescent layers 47 are, as described above, made up of the luminescent layers 47R, 47G, and 47B which emit light of the respective three colors. The luminescent layer 47R is provided in each sub-pixel 2R so as to have a stripe shape. The luminescent layer 47G is provided in each sub-pixel 2G so as to have a stripe shape. The luminescent layer 47B is provided in each sub-pixel 2B so as to have a stripe shape.

The luminescent layers 47R, 47G, and 47B are each preferably made of a material with high luminous efficiency, such as a low-molecular fluorescent dye and a metal complex.

An electron transfer layer (not shown) and an electron injection layer (not shown) are stacked in this order on the luminescent layers 47R, 47G, and 47B and the hole injection layer/hole transfer layer 46. The electron transfer layer and the electron injection layer are formed throughout the entire display region.

The electron transfer layer is a layer that has the function of increasing efficiency in transferring electrons from the second electrode 48 to the luminescent layers 47R, 47G, and 47B. The electron injection layer is a layer that has the function of increasing efficiency in injecting electrons from the second electrode 48 into the electron transfer layer. Note that the electron transfer layer and the electron injection layer may be provided integrally as a single layer instead of being provided as separate layers.

The second electrode 48 is a layer that has the function of injecting electrons into the luminescent layers 47. The second electrode 48 is provided on the electron transfer layer uniformly throughout the entire display region. The second electrode 48 serves as a cathode in the present embodiment.

In the following description, (i) each of the first electrodes 44, (ii) the hole injection layer/hole transfer layer 46, (iii) a corresponding one of the luminescent layers 47, (iv) the electron transfer layer, (v) the electron injection layer, and (vi) the second electrode 48 may be collectively called an organic EL element.

Note that the first electrodes 44 and the second electrode 48 may serve as a cathode and an anode, respectively. In this case, the stack order of layers from the first electrode 44 through the second electrode 48 is reverse to the above-described order.

The organic EL substrate 5 is arranged in this way.

The organic EL substrate 5 is attached to the sealing substrate 7 via the adhesive layer 6, so that an organic EL display panel is provided. That is, the organic EL element is sealed by the supporting substrate 41, the adhesive layer 6, and the sealing substrate 7.

The organic EL display panel is connected with the image control section (not shown), so that the organic EL display device 3 is provided.

Note that, in the organic EL element, arrangements other than the first electrode 44, the second electrode 48, and the luminescent layer 47 may be inserted appropriately. The organic EL substrate 5 may further include a blocking layer for blocking one of electrically charged carriers (i.e., a positive hole or an electron).

(Method for Manufacturing Organic EL Display Device 3)

Figure 4:
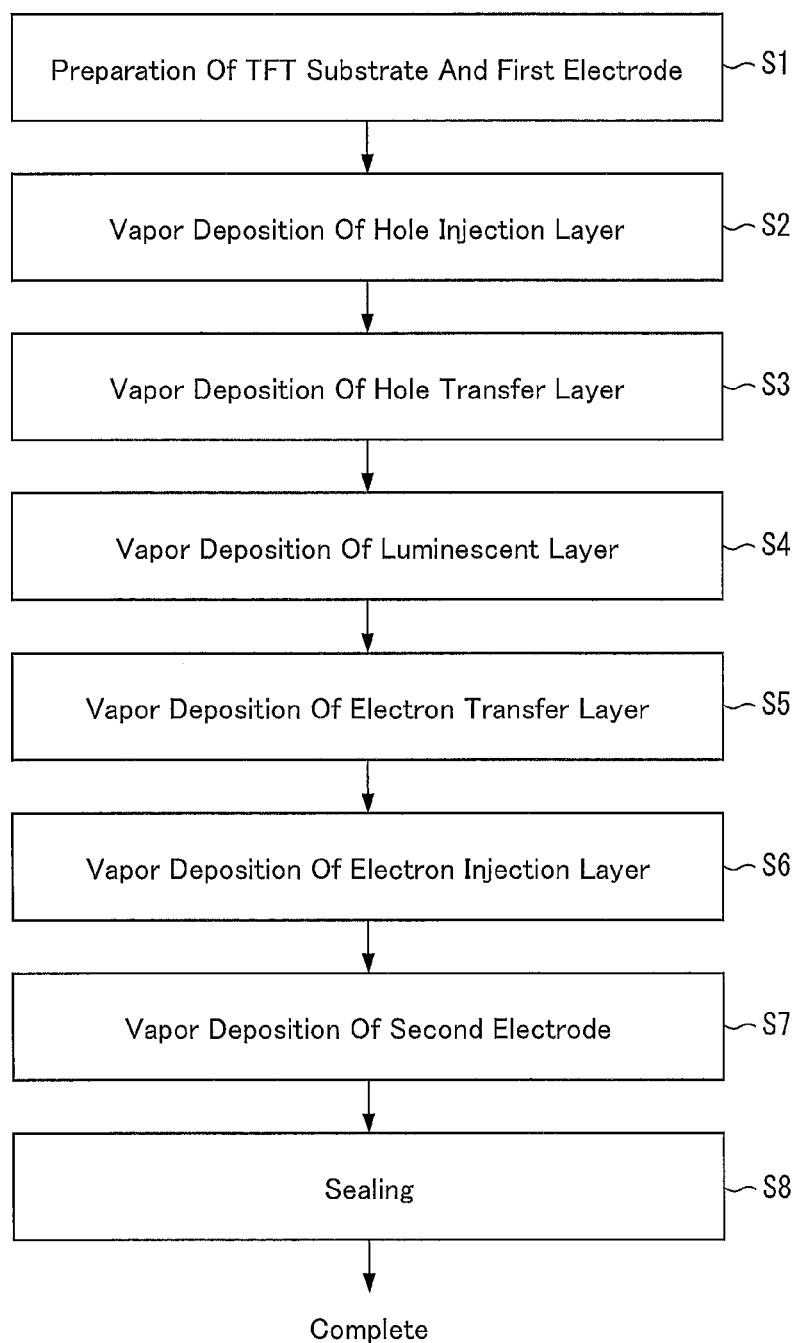
FIG. 4 is a flow chart showing successive steps for manufacturing an organic EL display device.

Next, the following description will discuss a method for manufacturing the organic EL display device 3 with reference to FIGS. 3 and 4.

FIG. 4 is a flowchart indicating successive steps for manufacturing the organic EL display device 3.

First, the method manufactures a film formation substrate 40.

The method forms TFTs 42, an interlayer insulating film 43, and first electrodes 44 on the supporting substrate (step S1). The supporting substrate 41 can be, for example, a rectangular glass plate having a thickness of approximately 1 mm, a long-side length of 500 mm, and a short-side length of 400 mm. Note that the supporting substrate 41 may be a plastic substrate.

A pattern of the TFTs 42 can be formed on the supporting substrate 41 by a known method such as sputtering. When the TFTs 42 are formed on the supporting substrate 41, gate lines and signal lines are also formed.

Then, the method for manufacturing the organic EL display device 3 (i) applies a photosensitive resin onto the supporting substrate 41 so as to cover the TFTs 42, the gate lines, and the signal lines, and (ii) carries out patterning with respect to the photosensitive resin by photolithography. This forms the interlayer insulating film 43.

The interlayer insulating film 43 can be made of, for example, an insulating material such as an acrylic resin or a polyimide resin. The interlayer insulating film 43 has a thickness of, for example, approximately 2 µm. The interlayer insulating film 43 is simply required to have a thickness that can compensate for a difference in level created by the TFTs 42. The thickness is thus not particularly limited.

The method next forms, in the interlayer insulating film 43, contact holes for electrically connecting the first electrodes 44 with the TFTs 42.

The method then forms a conductive film, by which the first electrodes 44 are to be constituted, on the interlayer insulating film 43 by, for example, a sputtering method. The method then applies a photoresist onto the conductive film thus formed, carries out patterning with respect to the photoresist by photolithography, and then carries out etching and washing so as to remove the conductive film and the photoresist in a part other than regions where the first electrodes 44 are to be provided. This (i) forms a pattern of the first electrodes 44 and (ii) connects the first electrodes 44 with the TFTs 42 via the contact holes.

The conductive film material for the first electrodes 44 is, for example, (i) a transparent conductive material such as ITO (indium tin oxide), IZO (indium zinc oxide), and gallium-added zinc oxide (GZO) or (ii) a metal material such as gold (Au), nickel (Ni), and platinum (Pt).

The conductive film can be formed by a method such as the sputtering method, a vacuum vapor deposition method, a chemical vapor deposition (CVD) method, a plasma CVD method, and a printing method. An etchant for the etching carried out with respect to the conductive film can be ferric chloride or the like.

The first electrodes 44 are, for example, formed by the sputtering method with use of ITO so as to each have a thickness of approximately 100 nm.

The method next forms a predetermined pattern of an edge cover 45. The edge cover 45 can be patterned (i) with use of an insulating material similar to that for the interlayer insulating film 43 and (ii) in a manner similar to that for the interlayer insulating film 43. The edge cover 45 is, for example, formed by photolithography with use of an acrylic resin so as to have a thickness of, for example, approximately 1 µm.

In this manner, (i) a TFT substrate which is made up of the supporting substrate 41 and the TFTs 42 provided on the supporting substrate 41 and (ii) the first electrodes 44 can be manufactured (step S1).

The method next forms, on the substrate manufactured in the step S1, a hole injection layer/hole transfer layer 46 by vapor deposition (steps S2 and S3).

The method first carries out, with respect to the substrate manufactured in the step S1, (i) a bake under a reduced pressure for dehydration and (ii) an oxygen plasma treatment for surface washing of the first electrodes 44.

The method then forms, by the vapor deposition method, the hole injection layer/hole transfer layer 46 on the substrate throughout the entire display region of the substrate (S2 and S3).

Specifically, the method tightly fixes, onto the substrate, an open mask that has an opening corresponding to the entire display region. The method then, while rotating the substrate and the open mask together, carries out, through the opening of the open mask and throughout the entire display region of the substrate, vapor deposition of a vapor deposition material, by which the hole injection layer/hole transfer layer 46 is to be constituted.

In the present embodiment, the hole injection layer/hole transfer layer 46 is described as an integrated layer. Note, however, that the hole injection layer and the hole transfer layer may be formed as separate layers.

In this case, the method first forms, on the substrate having been subjected to the oxygen plasma treatment, the hole injection layer by vapor deposition in accordance with a vapor deposition method similar to that described above (step S2), and then forms the hole transfer layer on the hole injection layer in accordance with a similar vapor deposition method (step S3). The hole injection layer and the hole transfer layer each have, for example, a thickness of approximately not smaller than 10 nm but not larger than 100 nm.

The hole injection layer and the hole transfer layer are each made of a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above, (ii) a polysilane compound, (iii) a vinylcarbazole compound, (iv) and a monomer, an oligomer, or a polymer of a cyclic conjugated or chain conjugated system, such as a thiophene compound and an aniline compound.

For example, the method forms a hole injection layer/hole transfer layer 46 that is made of 4,4'-bis [N-(1-naphthyl)-N-phenylamino]biphenyl($\alpha$-NPD) and that has a thickness of 30 nm.

In this way, the film formation substrate 40 is formed.

The method next forms luminescent layers 47 on the film formation substrate 40 (step S4). The luminescent layers 47 are patterned with use of the vapor deposition device 1 (described later).

The luminescent layers 47 are formed on the hole injection layer/hole transfer layer 46 and in openings between the edge covers 45. The luminescent layer 47R is formed in each sub-pixel 2R so as to have a stripe shape, the luminescent layer 47G is formed in each sub-pixel 2G so as to have a stripe shape, and the luminescent layer 47B is formed in each sub-pixel 2B so as to have a stripe shape.

The method carries out, with use of the vapor deposition device 1, vapor deposition of the luminescent layers 47R, 47G, and 47B in predetermined regions for respective colors (selective vapor deposition).

A vapor deposition mask used for use in vapor deposition of each of the luminescent layers 47R, 47G, and 47B is a fine mask which has an opening having a width corresponding to the each of the sub-pixels 2R, 2G, and 2B.

The luminescent layers 47R, 47G, and 47B are each made of a material with high luminous efficiency, such as a low-molecular fluorescent dye and a metal complex.

For example, the luminescent layers 47R, 47G, and 47B are each made of a material such as anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, a derivative of any of the above, a tris(8-quinolinate) aluminum complex, a bis(benzoquinolinate) beryllium complex, a tri(dibenzoylmethyl)phenanthroline europium complex, or ditoluyl vinyl biphenyl.

For example, each of the luminescent layers 47R, 47G, and 47B has a thickness of not smaller than 10 nm but not larger than 100 nm.

Note that details of the step S4 will be described later.

The method next carries out vapor deposition of an electron transfer layer throughout the entire display region of the film formation substrate 40 so that the electron transfer layer covers the hole injection layer/hole transfer layer 46 and the luminescent layers 47 (step S5). The electron transfer layer can be formed in a manner similar to that described for the steps S2 and S3 for forming the hole injection layer/hole transfer layer 46.

The method next carries out vapor deposition of an electron injection layer throughout the entire display region of the film formation substrate 40 so that the electron injection layer covers the electron transfer layer (S6). The electron injection layer can be formed in a manner similar to that described for the steps S2 and S3 for forming the hole injection layer/hole transfer layer 46.

That is, each of the electron transfer layer and the electron injection layer is formed by (i) tightly fixing, onto the film formation substrate 40, an open mask that has an opening corresponding to the entire display region and (ii) then, while rotating the film formation substrate 40 and the open mask together, carrying out, through the opening of the open mask and throughout the entire display region of the film formation substrate 40, vapor deposition of a vapor deposition material, by which the hole transfer layer or the hole injection layer is constituted.

The electron transfer layer and the electron injection layer can each be made of, for example, quinoline, perylene, phenanthroline, bis-styryl, pyrazine, triazole, oxazole, oxadiazole, fluorenone, a derivative or a metal complex of any of the above, or LiF (lithium fluoride).

As described above, the electron transfer layer and the electron injection layer may be provided integrally as a single layer or separately as independent layers. The electron transfer layer and the electron injection layer each have a thickness of, for example, approximately not smaller than 1 nm but not larger than 100 nm. A total of the thickness of the electron transfer layer and the thickness of the electron injection layer is for example, approximately not smaller than 20 nm but not larger than 200 nm.

For example, the electron transfer layer is made of Alq (tris(8-hydroxy quinoline)aluminum) and has a thickness of 30 nm, and the electron injection layer is made of LiF (lithium fluoride) and has a thickness of 1 nm.

The method next carries out vapor deposition of a second electrode 48 throughout the entire display region of the film formation substrate 40 so that the second electrode 48 covers the electron injection layer (step S7). The second electrode 48 can be formed in a manner similar to that described for the steps S2 and S3 for forming the hole injection layer/hole transfer layer 46.

That is, the second electrode 48 is formed by (i) tightly fixing, onto the film formation substrate 40, an open mask that has an opening corresponding to the entire display region and (ii) then, while rotating the film formation substrate 40 and the open mask together, carrying out, through the opening of the open mask and throughout the entire display region of the film formation substrate 40, vapor deposition of a vapor deposition material, by which the second electrode 48 is constituted.

The second electrode 48 is suitably made of a material (electrode material) such as a metal with a small work function. Examples of such an electrode material include a magnesium alloy (for example, MgAg), an aluminum alloy (for example, AlLi, AlCa, or AlMg) and calcium metal. The second electrode 48 has a thickness of, for example, not smaller than 50 nm but not larger than to 100 nm. For example, the second electrode 48 can be made of aluminum and have a thickness of 50 nm.

The second electrode 48 may be further provided thereon with a protective film that covers the second electrode 48 and that prevents infiltration of oxygen, moisture and the like present outside into the organic EL elements. The protective film is made of an electrically insulating or conductive material such as silicon nitride and silicon oxide. The protective film has a thickness of, for example, not smaller than 100 nm but not larger than to 1000 nm.

In this way, the organic EL substrate 5 including the luminescent layers 47 and the second electrode 48 can be formed on the film formation substrate 40.

The method then attaches the organic EL substrate 5 to a sealing substrate 7 with use of an adhesive layer 6 so that the organic EL elements are contained. This sealing process is carried out in an inert gas atmosphere.

The sealing substrate 7 is, for example, an insulating substrate, such as a glass substrate and a plastic substrate, having a thickness of not smaller than 0.4 mm but not larger than 1.1 mm.

Connecting the organic EL display panel, which is thus made, with the image control section and the like allows the organic EL display device 3 to be provided.

The organic EL display device 3, upon receipt of a signal transmitted from the image control section through a gate line and a signal line, turns on a TFT 42 and thus allows (i) positive holes to be injected from a first electrode 44 into a luminescent layer 47 and further (ii) electrons to be injected from the second electrode 48 into the luminescent layer 47. This causes the positive holes and the electrons to recombine with each other inside the luminescent layer. The positive holes and the electrons thus recombined are emitted in the form of light of a predetermined color when becoming inactive.

Controlling respective light emission luminances of the sub-pixels 2R, 2G, and 2B allows a predetermined image to be displayed in the display region of the organic EL display device 3.

(Arrangement of Vapor Deposition Device)

Figure 1:
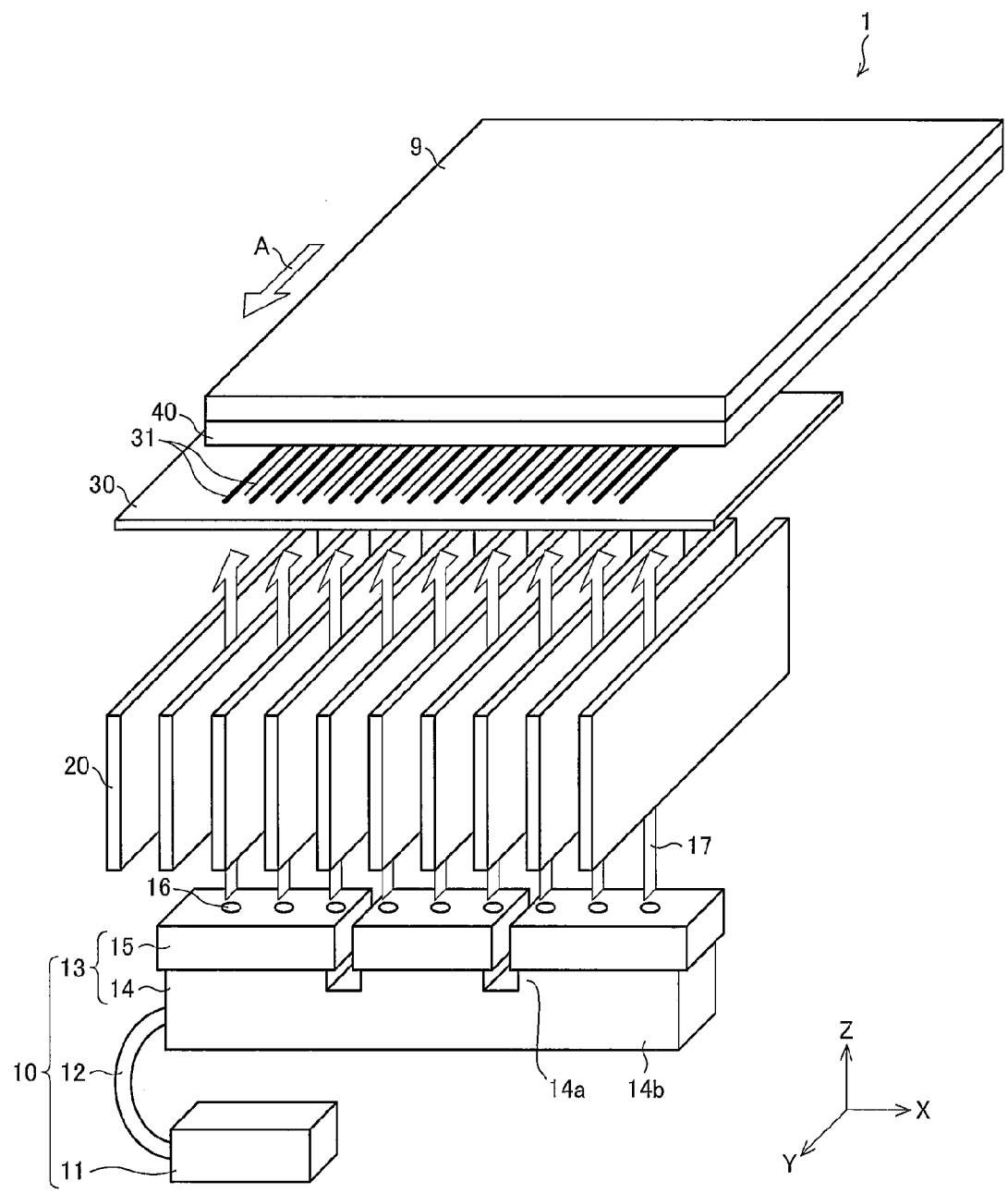
FIG. 1 is a perspective view illustrating an arrangement of a vapor deposition device of First Embodiment.
Figure 2:
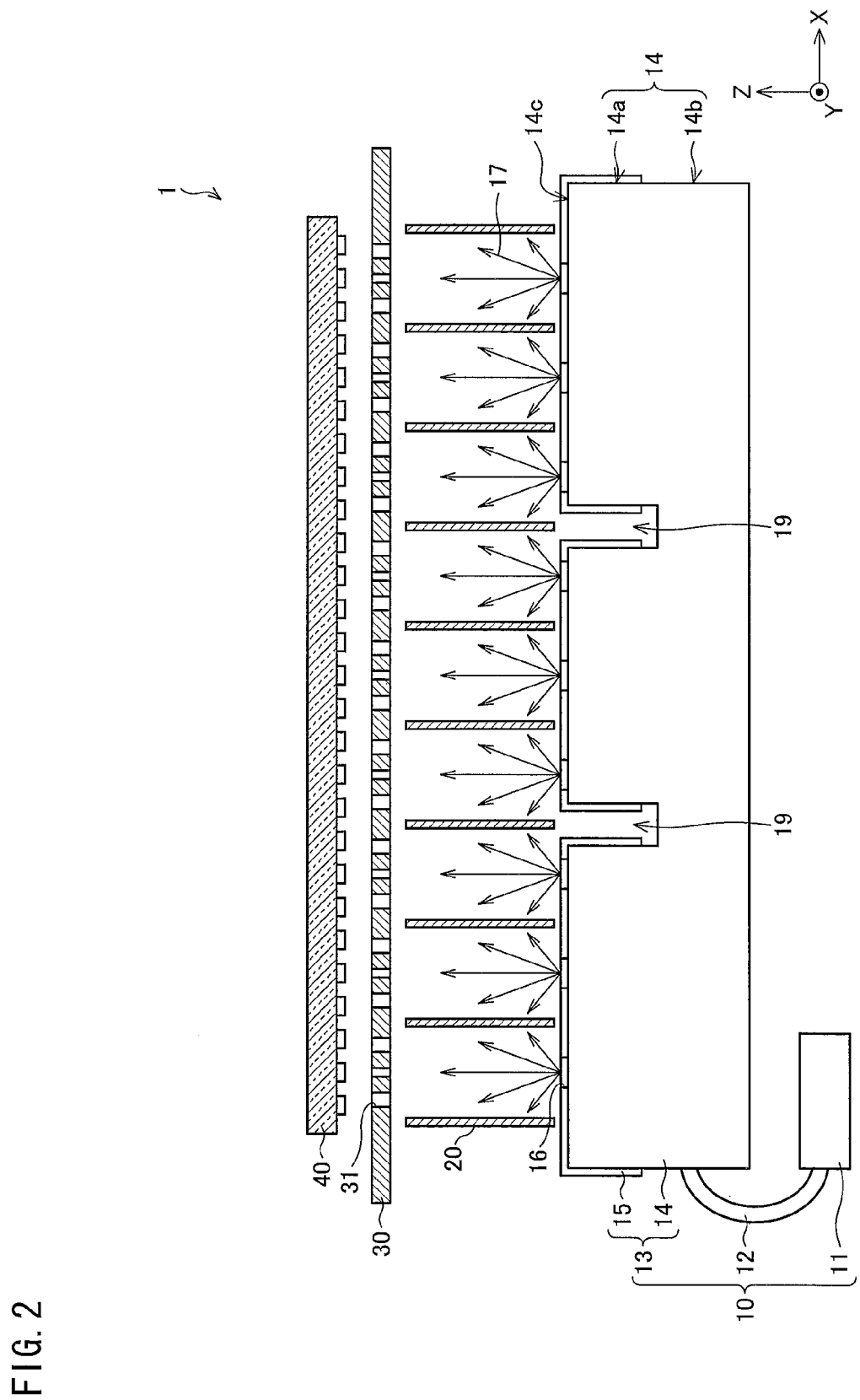
FIG. 2 is a cross-sectional view illustrating an arrangement of the vapor deposition device of First Embodiment.

The following describes, with reference to FIGS. 1 and 2, an arrangement of the vapor deposition device 1 which is suitable as a vapor deposition device for use in selective vapor deposition of the luminescent layers 47R, 47G, and 47B.

FIG. 1 is a perspective view illustrating an arrangement of the vapor deposition device 1 in accordance with First Embodiment. FIG. 2 is a cross-sectional view illustrating an arrangement of the vapor deposition device.

The vapor deposition device 1 is a vapor deposition device for forming a pattern of a vapor-deposited film on a substrate. In the present embodiment, the vapor deposition device 1 is specifically described as a vapor deposition device that is used for forming patterns of the luminescent layers 47R, 47G, and 47B for the respective sub-pixels 2R, 2G, and 2B of the film formation substrate 40 constituting the organic EL display device 3.

Note that the vapor deposition device 1 is not necessarily limited to use in forming a vapor-deposited film to manufacture an organic EL display device. The vapor deposition device 1 can be used in manufacture of another device that requires that, in forming a vapor-deposited film, positions of a plurality of control plates 20 relative to respective positions of a plurality of injection holes 16 are equal.

The vapor deposition device 1 includes a vapor deposition source 10, the plurality of control plates 20, a vapor deposition mask 30, and a substrate driving mechanism (substrate driving section) 9. The vapor deposition device 1 further includes (i) a vacuum chamber (film growing chamber) (not shown in the drawings) in which a vapor deposition treatment is carried out, (ii) a vacuum pump (not shown in the drawings) for reducing a pressure inside the vacuum chamber to a predetermined air pressure, (iii) a heater (not shown in the drawings) for heating the vapor deposition source 10, (iv) a control section (not shown in the drawings) for controlling driving of the entire vapor deposition device 1, and (v) the like.

The vapor deposition source 10, the plurality of control plates 20, the vapor deposition mask 30, and the substrate driving mechanism 9 are provided inside the vacuum chamber. When the vapor deposition treatment is carried out, the film formation substrate 40 is placed in the vacuum chamber. Then, after the film formation substrate 40 is placed in the vacuum chamber, the vacuum chamber is hermetically sealed and reduced to a predetermined air pressure.

The vapor deposition source 10, the control plates 20, the vapor deposition mask 30, and the substrate driving mechanism 9 are provided so as to be spaced apart from one another from a bottom toward a top of the vacuum chamber.

The vapor deposition source 10, the control plates 20, and the vapor deposition mask 30 are fixedly provided in the vacuum chamber. That is, when the vapor deposition treatment is carried out, respective positions of (i) the vapor deposition source 10, (ii) the control plates 20, and (iii) the vapor deposition mask 30 relative to one another do not change. When the vapor deposition source 10 and a nozzle 13 are heated, misalignment of the plurality of control plates 20 is smaller than misalignment of the plurality of nozzles 16.

The substrate driving mechanism 9, when the vapor deposition treatment is carried out, (i) holds the film formation substrate 40 by, for example, adhering the film formation substrate 40 to the substrate driving mechanism 9 by suction and (ii) scans (moves), in one direction, the film formation substrate 40 thus held. In FIG. 1, the direction in which the substrate driving mechanism 9 scans the film formation substrate 40 (substrate scanning direction) is indicated by an arrow A. A scanning direction of the film formation substrate 40 is a Y direction (first direction).

The vapor deposition source 10 includes a vapor deposition material supply source (vapor deposition source crucible) 11, an inlet tube 12, and the nozzle (injection section) 13.

The nozzle 13 includes a nozzle main body (injection section main body) 14 and a plurality of blocks 15.

The blocks 15 have the plurality of injection holes 16 from which vapor deposition particles 17, by which a vapor-deposited film is to be constituted, are injected toward the film formation substrate 40 when the vapor deposition treatment is carried out. The plurality of injection holes 16 of the blocks 15 are arranged in a row along a direction perpendicular to the scanning direction of the film formation substrate 40. The direction along which the plurality of injection holes 16 are arranged in a row is an X direction (second direction).

That is, length directions of the respective plurality of blocks 15 are parallel to one another, and the plurality of blocks 15 are arranged in a row along the X direction. This allows the plurality of injection holes 16 to be arranged continuously along the X direction for a long distance. Accordingly, it becomes possible to increase an area in which a vapor-deposited film pattern can be formed per scanning of the film formation substrate 40, and thus reduce time for production.

In the present embodiment, a whole arrangement including (i) the vapor deposition material supply source 11 and (ii) the nozzle 13 having the injection holes 16 is called the vapor deposition source 10.

The film formation substrate 40 is scanned (moved) by the substrate driving mechanism 9 in the Y direction when the vapor deposition treatment is carried out. That is, when the vapor deposition treatment is carried out, the film formation substrate 40 moves in one direction relative to the nozzle 13, the control plates 20, and the vapor deposition mask 30.

The vapor deposition material supply source 11 contains therein a vapor deposition material to be deposited onto the film formation substrate 40. The vapor deposition material is a material which is to constitute any one of the luminescent layer 47R, 47G, and 47B.

The inlet tube 12 is a tube which connects the vapor deposition material supply source 11 and the nozzle main body 14 with each other. One end of the inlet tube 12 is connected with the nozzle main body 14, and the other end of the inlet tube 12 is connected with the vapor deposition material supply source 11.

The vapor deposition material supply source 11 is heated by the heater (not shown) when the vapor deposition treatment is carried out. This causes the vapor deposition material in the vapor deposition material supply source 11 to be vaporized, and the vaporized vapor deposition material is guided through the inlet tube 12 into the nozzle main body 14. Then, the vapor deposition material guided into the nozzle main body 14 is injected, as the vapor deposition particles 17, from the injection holes 16 of the blocks 15, and is passed through openings 31 of the vapor deposition mask 30 so as to be deposited onto the film formation substrate 40.

The vapor deposition material supply source 11 may be provided outside the vacuum chamber. For example, it is possible to employ an arrangement in which (i) the vapor deposition material supply source 11 is provided in a load-lock chamber, which is provided separately from the vacuum chamber and (ii) the inlet tube, which introduces the vaporized vapor deposition material, is connected with the vacuum chamber.

The load-lock chamber is capable of discharging or venting air separately from the vacuum chamber (film growing chamber). This allows material resupply to be carried out without opening the vacuum chamber to the atmosphere. Further, in a case where the load-lock chamber is smaller than the vacuum chamber, time required until a desired reduced-pressure state is achieved can be reduced as well.

The nozzle 13 includes the plurality of divided blocks 15, to all of which the vapor deposition material is supplied from the vapor deposition material supply source 11.

In the present embodiment, the nozzle 13 is described as a nozzle including a plurality of blocks 15 which are one-dimensionally arranged along the X direction, i.e., a plurality of blocks 15 whose injection holes 16 are arranged linearly. Note, however, that the nozzle 13 is not limited to this, and can include a plurality of blocks 15 which are two-dimensionally arranged along the Y direction as well as the X direction, i.e., a plurality of blocks 15 whose injection holes 16 are arranged planarly.

A vapor deposition source 10 that includes a nozzle 13 having the planarly arranged injection holes 16 is called a planar vapor deposition source.

In a case of using the planar vapor deposition source, the film formation substrate 40 may be scanned in the Y direction, but does not necessarily have to be scanned. In a case where a vapor deposition can be carried out at once with respect to the entire film formation substrate 40, the film formation substrate 40 may be fixed instead of being scanned.

An effect similar to that obtained by the vapor deposition device 1 (described later) can be also obtained by using, for example, a nozzle 13 that includes blocks 15 which are arranged in a 3×3 grid (e.g., like a face of a Rubik's Cube (Registered Trademark)) and each of which has injection holes 16 that are two-dimensionally arranged, it is possible to have.

Note that specific descriptions of the nozzle 13 will be given later.

The plurality of control plates 20 are provided between the nozzle 13 and the vapor deposition mask 30.

The control plates 20 restrict a range in which vapor deposition flow spreads. The control plates 20 restrict an incident angle, with respect to the openings 31 of the vapor deposition mask 30, of the vapor deposition particles 17 injected from the plurality of injection holes 16. This allows restricting an incident angle of the vapor deposition particles 17 with respect to the film formation substrate 40.

The control plates 20 can be made of a material that (i) allows the control plates 20 to be prepared with high processing accuracy and (ii) is highly heat-resistant. The control plates 20 are preferably made of a material that has little change in size caused by heat. Examples of such a material encompass a metal such as aluminum or SUS304.

(a) of FIG. 20 is a perspective view illustrating a support for the control plates 20. (b) of FIG. 20 is a cross-sectional view taken along a line G-G' in (a) of FIG. 20.

For example, it is possible to employ a structure in which each of the plurality of control plates 20 is fixed in the vacuum chamber by means of the support 21.

The support 21 has an opening 21a in which the plurality of control plates 20 are inserted. The support 21 is fixed in the vacuum chamber.

The plurality of control plates 20 are inserted in the opening 21a of the support 21 so that main surfaces of the respective control plates 20 are parallel to one another. This fixes positions of the plurality of control plates 20. Note that a mechanism for fine adjustment of the position of the support 21 may be provided separately. By making a fine adjustment of the position of the support 21 by means of the mechanism, it is also possible to make a fine adjustment to respective positions of (i) the control plates 20 and (ii) the nozzle 13 relative to each other.

In order to prevent re-vapor deposition of vapor deposition particles adhered to the control plates 20, the control plates 20 are arranged so as to have a temperature lower than those of the vapor deposition source 10 and the nozzle 13 which are heated. That is, since the control plates 20 are spaced apart from the vapor deposition source 10 and the nozzle 13 by some distance, the control plates 20 have a temperature lower than those of the vapor deposition source 10 and the nozzle 13 even in a case where the vapor deposition source 10 and the nozzle 13 are heated. It is also possible to employ an arrangement in which the control plates 20 or the support 21 is provided with, for example, a cooling mechanism of a water-cooling type or the like, so that the control plates 20 have a temperature lower than those of the vapor deposition source 10 and the nozzle 13 which are heated.

On the other hand, the nozzle 13 is heated to a temperature at which no vapor deposition particle can be adhered to the nozzle 13.

Accordingly, since (i) the control plates 20 have a temperature lower than that of the nozzle 13 and (ii) misalignment of the control plates 20 caused by heating is smaller than misalignment of the injection holes 16 of the nozzle 13, the misalignment of the control plates 20 is less problematic than the misalignment of the injection holes 16 is.

An incident angle of the vapor deposition particles 17 with respect to the openings 31 of the vapor deposition mask 30 is determined based on respective positions of (i) the injection holes 16 and (ii) the control plates 20 relative to each other.

That is, in a case where the respective positions of the injection holes 16 and the control plates 20 relative to each others are changed, a range in which a vapor-deposited film is deposited onto the film formation substrate 40 is changed due to the vapor deposition particles 17 injected from the injection hole 16.

It is therefore important to suppress a change in the respective positions of the injection holes 16 and the control plates 20 relative to each other in order to pattern the luminescent layers 47 with high definition on the film formation substrate 40.

Each of the plurality of control plates 20 is perpendicular to the film formation substrate 40. That is, in a case where a surface of a control plate 20 having the largest area among the surfaces of the control plate 20 is a main surface of the control plate 20, the main surface is parallel to a Y-Z plane. The plurality of control plates 20 are arranged sequentially along the X direction so as to be parallel to one another.

In a plan view of the vapor deposition device 1, each of the plurality of control plates 20 is parallel to the scanning direction of the film formation substrate 40, and is provided between corresponding ones of the plurality of injection holes 16.

In this way, use of the control plates 20 allows an incident angle, with respect to the film formation substrate 40, of the vapor deposition particles 17 injected from the injection holes 16 to be restricted to a certain range.

This makes it possible to prevent the vapor deposition particles 17 from flying orthogonally onto the film formation substrate 40. Accordingly, it is possible to prevent unnecessary adhesion of a vapor-deposited film onto a side section of a predetermined vapor deposition pattern deposited onto the film formation substrate 40. This makes it possible to form a vapor-deposited film pattern with high definition.

Note that positions of the injection holes 16 between the respective control plates 20 in a plan view (or in a cross section parallel to an X-Z plane as shown in FIG. 2) are simply required to not vary among the injection holes 16. That is, each of the injection holes 16 does not necessarily have to be positioned in a middle between corresponding ones of the control plates 20 in the plan view (or in the cross section parallel to the X-Z plane as shown in FIG. 2).

For example, the center of an injection hole 16 may coincide with the center of a control plate 20. That is, a control plate 20 may be present directly above (in a Z direction) an injection hole 16.

The vapor deposition mask 30 has the openings 31, each of which is a hole formed, in a desired position and a desired shape, through the vapor deposition mask 30. Only vapor deposition particles 17 that have passed through the openings 31 reach the film formation substrate 40 so as to form a vapor-deposited film (luminescent layer 47) on the film formation substrate 40. The openings 31 are formed through the vapor deposition mask 30 so as to have a stripe shape.

A length direction of each of the openings 31 is parallel to the scanning direction of the film formation substrate 40. The plurality of openings 31 are arranged side by side sequentially along a direction (i.e., the X direction) perpendicular to the scanning direction of the film formation substrate 40 so as to be parallel to one another.

The vapor deposition mask 30 is a small mask (fine mask) having a length smaller than a length, in the scanning direction, of the film formation substrate 40. The vapor deposition mask 30 is formed integrally with the vapor deposition source 10.

A vapor-deposited film is deposited on the film formation substrate 40 while the film formation substrate 40 is scanned above and relative to the vapor deposition mask 30, which is the small mask. This allows the vapor-deposited film to be patterned in a stripe shape on the film formation substrate 40.

By using the small mask as the vapor deposition mask 30 and carrying out the vapor deposition treatment by scanning the film formation substrate 40 relative to the vapor deposition mask 30, it is possible, even in a case of carrying out vapor deposition with respect to a large-sized film formation substrate 40, to use a vapor deposition mask 30 that is smaller in size than the film formation substrate 40. This makes it possible to prevent bending or the like of the vapor deposition mask 30 and thus maintain a fixed distance between the film formation substrate 40 and the vapor deposition mask 30. It is therefore possible to carry out high-definition patterning.

Note that, in cases other than the case of forming the luminescent layers 47 on the film formation substrate 40, for example, in a case of forming a vapor-deposited film throughout the entire display region of the film formation substrate 40, a vapor deposition mask (open mask) having an opening throughout an entire region that corresponds to the display region is used instead of the vapor deposition mask 30 having openings with a stripe shape like the openings 31.

Note that, in a case of carrying out a vapor deposition throughout the entire display region of the film formation substrate 40, (i) no control plate 20 is necessary and (ii) the vapor deposition may be carried out in a state where the film formation substrate 40 and the vapor deposition mask 30 are in close contact with each other.

In this case, a vapor deposition mask 30 that is equivalent in size (equivalent in length along the Y direction) to the film formation substrate 40 is used to carry out vapor deposition (i) moving a surface of the film formation substrate 40 and a surface of the vapor deposition mask 30 across each other in a state where the surfaces are in contact with each other, or (ii) collectively all over the film formation substrate 40. Examples of a vapor-deposited film that is patterned for each pixel encompass a luminescent layer. Examples of a vapor-deposited film that is patterned throughout the entire display region encompass a hole transfer layer and the like.

(Description of Arrangement of Nozzle 13)

Next, an arrangement of the nozzle 13 is specifically described with reference to FIGS. 1 and 2, (a) and (b) of FIG. 5, and FIG. 6.

(a) of FIG. 5 is a plan view illustrating an arrangement of a conventional nozzle 113, and (b) of FIG. 5 is a plan view illustrating an arrangement of the nozzle 13 in accordance with the present embodiment.

As illustrated in (a) of FIG. 5, the conventional nozzle 113 is formed integrally and continuously in a length direction thereof and has injection holes 116. By contrast, the nozzle 13 in accordance with the present embodiment includes the plurality of blocks 15, which are three parts into which the nozzle 113 is divided. The plurality of blocks 15 are arranged side by side sequentially along a length direction. Each of the blocks 15 has a rectangular shape in a plan view.

(a) of FIG. 6 is a perspective view illustrating an arrangement of the nozzle 13, and (b) of FIG. 6 is a cross-sectional view of the nozzle 13.

As illustrated in FIGS. 1 and 2 and (a) and (b) of FIG. 6, a vapor deposition material is supplied from the vapor deposition material supply source 11 to the nozzle 13 via the inlet tube 12.

The nozzle 13 includes three blocks 15 which are arranged in a row along the length direction so as to be spaced apart from one another. The nozzle 13 includes the nozzle main body 14, which is a hollow container, and the blocks 15.

The nozzle main body 14 and the blocks 15 are each preferably made of a material having as small a linear expansion coefficient as possible. For example, the nozzle main body 14 and the blocks 15 are each made of an inver material (an Fe alloy which contains Ni and in which a small amount of Co may be further mixed). The inver material has a linear expansion coefficient of approximately $0.1 \times 10^{-6}/°$ C. to $2 \times 10^{-6}/°$ C. at room temperature. This makes it possible to suppress misalignment of the injection holes 16 before and after heating.

Further, (i) the nozzle main body 14 and (ii) the blocks 15 may be made of respective different materials. For example, the nozzle main body 14 may be made of SUS304 or the like, and the blocks 15 may be made of an inver material or the like. This makes it possible to reduce (i) cost for manufacturing the nozzle main body 14 and (ii) the linear expansion coefficient of the block 15. Note that SUS304 has a thermal expansion coefficient of approximately $17 \times 10^{-6}/°$ C.

The nozzle main body 14 has a container shape (i.e., a recessed shape) having one or more openings on one surface of the nozzle main body 14.

The nozzle main body 14 has three openings 14c on a surface closer to a film formation substrate 40. The nozzle main body 14 is constituted by (i) three protruding sections 14a each having a protruding shape that causes a corresponding one of the openings 14c to protrude toward the film formation substrate 40 and (ii) a connection section 14b which connects the three protruding sections 14a. The three protruding sections 14a are provided integrally with the connection section 14b.

That is, each of the protruding sections 14a has an opening 14c throughout an entire upper surface (a surface parallel to the X-Z plane) of the each of the protruding sections 14a. As illustrated in (b) of FIG. 6, a cross section, parallel to the Y-Z plane, of each of the protruding sections 14a and the connection section 14b has a recessed shape in which an upper surface of the protruding section 14a has an opening.

The plurality of blocks 15 are lids which cover the respective plurality of openings 14c and the respective plurality of protruding sections 14a. By covering the openings 14c with the blocks 15, it is possible to inject the vapor deposition particles 17 from the injection holes 16 toward the film formation substrate 40. The plurality of blocks 15 are simply placed over the respective plurality of protruding sections 14a, and are not fixed to the respective plurality of blocks 15.

The plurality of protruding sections 14a are provided on the connection section 14b. That is, each of the plurality of protruding sections 14a protrudes from the connection section 14b in a Z direction (toward the film formation substrate 40).

The plurality of protruding sections 14a are three protruding sections 14a which are arranged along the length direction (X direction) of the nozzle 13. The plurality of protruding sections 14a are spaced apart from one another. Note that there is no opening between the protruding sections 14a.

The connection section 14b are provided below the plurality of protruding sections 14a so that the plurality of protruding sections 14a communicate with one another. One end of the inlet tube 12 is connected with one side surface of the connection section 14b.

The plurality of blocks 15 are separated from one another, and gaps 19 are provided between the respective plurality of blocks 15. That is, the plurality of blocks 15 are separated from one another via the respective gaps 19.

The injection holes 16 are provided through the blocks 15 so as to be arranged in a row with an equal interval on an upper surface (a surface parallel to the X-Z plane) of each of the blocks 15.

The gaps 19 are gaps which are provided between the respective plurality of blocks 15. The gaps 19 are provided between the respective plurality of blocks 15 so that a pitch between the injection holes 16 is equal over the plurality of blocks 15.

The gaps 19 are provided between the respective plurality of blocks 15 so that, when no heating is carried out, the pitch between the plurality of injection holes 16 is equal in the X direction over the plurality of blocks 15. This makes it possible to prevent misalignment between vapor-deposited film patterns corresponding to the respective blocks 15.

In a case where the nozzle 13 is used, a vapor deposition treatment is carried out by means of the vapor deposition device 1 in such a manner that a vapor deposition material vaporized from the vapor deposition material supply source 11 is supplied to the protruding sections 14a via the inlet tube 12 and the connection section 14b, and is then injected, as the vapor deposition particles 17, from the injection holes 16 to the outside of the nozzle 13.

When the vapor deposition treatment is carried out, the block 15s and the nozzle main body 14 are heated together.

However, (i) the plurality of injection holes 16 are formed in each of the plurality of blocks 15, which are provided separately from the nozzle main body 14 and cover the openings 14c of the nozzle main body 14 and (ii) the plurality of blocks 15 are separated from one another.

Accordingly, in a case where the plurality of blocks 15 are heated when the vapor deposition treatment is carried out, the plurality of blocks 15 extend independently of one another since the plurality of blocks 15 are separated from one another. This makes it possible to reduce misalignment of the plurality of injection holes 16 before and after the heating as compared with a case where a single long block is formed integrally with a nozzle main body like, for example, the nozzle 113 illustrated in (a) of FIG. 5.

This makes it possible to suppress occurrence of misalignment between (i) each of the plurality of control plates 20 and (ii) a corresponding one of the plurality of injection holes 16 during heating. This allows a vapor-deposited film pattern to be formed with high definition on the film formation substrate 40.

Further, the blocks 15 are not fixed to the nozzle main body 14. As such, even in a case where the protruding section 14a expands with heat due to the heating carried out at the time of a vapor deposition treatment, it is possible to suppress an effect which the thermal expansion of the protruding section 14a has on the blocks 15. This makes it possible to suppress misalignment of the injection holes 16 before and after the heating.

Further, since the gaps 19 are provided between the respective plurality of blocks 15, each of the plurality of blocks 15 extends with heat individually.

Further, since a length, in the length direction, of each of the blocks 15 is smaller than a length, in the length direction, of the nozzle main body 14, a length by which a single block 15 extends by heat is smaller than that in a case where a length, in the length direction, of a block 15 is equivalent to a length, in the length direction, of the nozzle main body 14. It is therefore possible to suppress misalignment of the injection holes 16 before and after the heating.

As illustrated in (b) of FIG. 6, in order to prevent the nozzle main body 14 from interfering with the blocks 15 when the nozzle main body 14 extends by heat, a gap is provided also between an inner side surface of each of the blocks 15 and an outer side surface, facing the inner side surface, of the nozzle main body 14.

As such, when the vapor deposition treatment is carried out by the vapor deposition device 1, (i) vapor deposition particles 17 are injected from the injection holes 16 and (ii) vapor deposition particles 17a are leaked to the outside of the nozzle 13 from the gap between the inner side surface of each of the blocks 15 and the outer side surface, facing the inner side surface, of the nozzle main body 14.

However, openings of each of the blocks 15, other than the injection holes 16, of each of the blocks 15, that is, the gap between the inner side surface of each of the blocks 15 and the outer side surface, facing the inner side surface, of the nozzle main body 14 faces downward (in a direction opposite to the vapor deposition mask 30 and the film formation substrate 40, i.e., a −Z direction).

As such, the vapor deposition particles 17a which have leaked to the outside of the nozzle 13 through the gap between the inner side surface of each of the blocks 15 and the outer side surface, facing the inner side surface, of the nozzle main body 14 do not reach the vapor deposition mask 30 and the film formation substrate 40.

As described above, the blocks 15 cover the respective plurality of protruding sections 14a. As such, even in a case where the vapor deposition particles 17a leak through the openings 14c other than the injection holes 16, it is possible to prevent the leaked vapor deposition particles 17a from reaching the film formation substrate 40.

In the above description, the nozzle 13 includes the divided three blocks 15. Note however, that the number of divisions of the blocks 15 is not limited to three. The number of the blocks 15 may be two, or may be four or more.

As described above, the vapor deposition method in accordance with the present embodiment includes a step in which, when the vapor deposition treatment is carried out, the vapor deposition particles 17, which constitute a vapor-deposited film pattern, are (i) caused to pass through between the plurality of control plates 20 for restricting an incident angle of the vapor deposition particles 17 with respect to the film formation substrate 40 and (ii) then injected so that the vapor deposition particles 17 reach the film formation substrate 40.

In the step of injecting the vapor deposition particles 17, the vapor deposition particles 17 are injected from the plurality of injection holes 16 formed in each of the plurality of blocks 15 separated from one another.

Accordingly, when the vapor deposition particles 17 reach the film formation substrate 40, an incident angle of the vapor deposition particles 17 with respect to the film formation substrate 40 is restricted by the control plates 20 within a certain range.

This makes it possible to prevent the vapor deposition particles 17 from flying orthogonally onto the film formation substrate 40. Accordingly, it is possible to prevent unnecessary adhesion of a vapor-deposited film onto a side section of a predetermined vapor deposition pattern deposited onto the film formation substrate 40. This makes it possible to form a vapor-deposited film pattern with high definition.

Further, in the step of injecting the vapor deposition particles 17, the vapor deposition particles 17 are injected from the plurality of injection holes 16 formed in each of the plurality of blocks 15 separated from one another.

Accordingly, since the plurality of blocks 15 extend independently of one another in a case where the plurality of blocks 15 are heated during the vapor deposition treatment, it is possible to reduce misalignment of the plurality of injection holes 16 before and after the heating, as compared with a case where a single long block is integrally formed.

This makes it possible to prevent occurrence of misalignment between (i) each of the plurality of control plates 20 and (ii) a corresponding one of the plurality of injection holes 16 during heating. This allows a vapor-deposited film pattern to be formed with high definition on the film formation substrate 40.

(Misalignment of Injection Holes Before and after Heating)

Next, the following description will discuss, with reference to (a) and (b) of FIG. 7 and (a) and (b) of FIG. 8, misalignment of the injection holes before and after the heating of the nozzle 13.

(a) and (b) of FIG. 7 each illustrate an arrangement of the conventional nozzle 113 which is not divided into a plurality of blocks. (a) of FIG. 7 is a plan view illustrating an arrangement of the nozzle 113 which has not been heated, and (b) of FIG. 7 is a plan view illustrating an arrangement of the nozzle 113 which has been heated.

(a) and (b) of FIG. 8 each illustrate an arrangement of the nozzle 13 in accordance with the present embodiment. (a) of FIG. 8 is a plan view illustrating an arrangement of the nozzle 13 which has not been heated, and (b) of FIG. 8 is a plan view illustrating an arrangement of the nozzle 13 which has been heated.

As described above, the nozzle 113 is conventionally constituted by a single block, whereas the nozzle 13 is divided into three blocks 15.

Note that a length (nozzle length), in the long-axis direction, of the nozzle 113 which has not been heated and a length (nozzle length), in a long-axis direction, of the nozzle 13 which has not been heated are each L. A length (nozzle length), in the long-axis direction, of each of the divided blocks 15 is Ls (L>Ls).

As illustrated in (a) of FIG. 7 and (a) of FIG. 8, a position of each of the injection holes 16 which have not been heated and a position of a corresponding one of the injection holes 116 which have not been heated coincide with each other. A linear expansion coefficient of each of the nozzles 113 and 13 is α.

Note that, even in a case where the nozzles 113 and 13 are heated, a position of an injection hole 113 that is located in a center of the nozzle 113 and a position of an injection hole 16 that is located in a center of the nozzle 13 do not change. That is, the nozzle 113 extends, from the injection hole 116 located in the center of the nozzle 113, upward and downward by the same length on the sheet of FIG. 7. The nozzle 13 extends, from the injection hole 16 located in the center of the nozzle 13, upward and downward by the same length on the sheet of FIG. 8.

In a case where temperatures of the respective nozzles 113 and 13 are increased by ΔT, an amount of extension ΔL of the nozzle 113 and an amount of extension ΔLs of each of the blocks 15 of the nozzle 13 are represented by the following formulas 1 and 2.

$$\Delta L = \alpha \times L \times \Delta T \quad \text{(formula 1)}$$

$$\Delta Ls = \alpha \times Ls \times \Delta T \quad \text{(formula 2)}$$

For example, (i) the nozzles 113 and 13 are each made of SUS304 (linear expansion coefficient: approximately $17 \times 10^{-6}/°C$.), (ii) the length L is 1 m, and (ii) the length Ls is 332 mm (the gap 19 between the respective plurality of blocks 15 has a width of 2 mm).

In a case where ΔT is 300° C., ΔL and ΔLs are as follows.
ΔL=5.1 mm
ΔLs=1.7 mm

An actual misalignment, before and after heating, of an injection hole 116 that is provided at a nozzle end and an actual misalignment, before and after heating, of an injection hole 16 that is provided at a nozzle end are approximately half the respective values shown above.

That is, as illustrated in (a) and (b) of FIG. 7, a misalignment, caused before and after the heating, of the injection hole 116 in an end section of the nozzle 113 is approximately 2.6 mm (ΔL/2), whereas, as illustrated in (a) and (b) of FIG. 8, a misalignment, caused before and after the heating, of the injection hole 16 in an end section of the nozzle 13 is approximately 0.9 mm (ΔLs/2). This shows that, as compared with the nozzle 113, the nozzle 13 has less misalignment, before and after the heating, of the injection hole 16 in the end section.

(Change in Range of Vapor Deposition Caused Before and after Heating)

Next, the following description will discuss, with reference to (a) and (b) of FIG. 9 and FIG. 10, a change in a range of vapor deposition carried out with respect to the film formation substrate 40, which change is caused by a change in an injection hole before and after heating.

(a) of FIG. 9 is a view illustrating a range of vapor deposition carried out in a case where an injection hole 16 is not misaligned. (b) of FIG. 9 is a view illustrating a range of vapor deposition carried out in a case where the injection hole 16 is misaligned.

FIG. 10 is a view illustrating a change in position of a vapor-deposited film pattern formed on the film formation substrate 40, which change is caused by misalignment of the injection hole 16.

In a case where, as illustrated in (a) of FIG. 9, $H_{sa}$ is a distance between the injection hole 16 and an upper end of each of the control plate 20, $H_{sm}$ is a distance between the injection hole 16 and the vapor deposition mask 30, and 2W is a width (a width between the control plates 20 adjacent to each other) of an opening between the control plates 20, one side P of a range of vapor deposition in which the vapor deposition particles 17 injected from the injection hole 16 are deposited onto the vapor deposition mask 30 after passing through between the control plates 20 is expressed by the following formula.

$$P = H_{sm}/H_{sa} \times W \quad \text{(formula 3)}$$

On the other hand, a case is considered where, as illustrated in (b) of FIG. 9, a position of a center of the injection hole 16 is misaligned leftward on the sheet of (b) of FIG. 9 by Δx relative to a position of a middle of the control plates 20 adjacent to each other.

In this case, a range of vapor deposition range in which the vapor deposition particles 17 having been injected from the injection hole 16 and passed through between the control plate 20 are deposited onto the vapor deposition mask 30 is represented by $P_R$ and $P_L$. $P_R$ is a distance, on the vapor deposition mask 30, between (i) a perpendicular from the injection hole 16 to the vapor deposition mask 30 and (ii) an end of the range of vapor deposition, which end is on the right hand side of (b) of FIG. 9. $P_L$ is a distance, on the vapor deposition mask 30, between (i) the perpendicular and (ii) an end of the range of vapor deposition, which end is on the left hand side of (b) of FIG. 9. $P_R$ and $P_L$ are respectively represented by the following formulas.

$$P_R = H_{sm}/H_{sa} \times (W - \Delta x) \quad \text{(formula 4)}$$

$$P_L = H_{sm}/H_{sa} \times (W + \Delta x) \quad \text{(formula 5)}$$

In a case where $H_{sm}$=180 mm, Has =80 mm, W=10 mm, and Δx=3 mm, P, $P_R$, and $P_L$ are as follows.
P=22.5 mm
$P_R$=15.75 mm
$P_L$=29.25 mm The range of vapor deposition thus has differences of ±7 mm on the right and left sides thereof.

In order for an opening 31 of the vapor deposition mask 30 to be included in the range of vapor deposition even in a case where the range of vapor deposition has the differences on the right and left sides thereof, the opening 31 can only be formed in a range of at least $2 \times P_R$=31.5 mm. Areas outside this range are shielded by the control plates 20 and therefore make no contribution to vapor deposition (film formation on the film formation substrate 40).

That is, it is necessary to have a design margin in which the misalignment of the injection hole is taken into consideration. This lowers a utilization rate of the vapor deposition material.

As shown in (a) and (b) of FIG. 8, etc., in a case where the nozzle 13 is divided into three parts like the blocks 15, a maximum amount of misalignment of the injection holes 16 of the nozzle 13 which has been heated becomes approximately ⅓, as shown in the formulas 1 and 2.

Accordingly, Δx in each of the formulas 4 and 5 also becomes ⅓. Therefore, the nozzle 13 in accordance with the present embodiment causes a reduction in amount of change in the range of vapor deposition before and after the heating and thus allows a reduction in design margin. This makes it possible to improve efficiency of use of the vapor deposition material.

Next, as illustrated in FIG. 10, the film formation substrate 40 and the vapor deposition mask 30 are separated from each other by a distance $D_g$. A position of a vapor-deposited film pattern formed on the film formation substrate 40 is determined based on an incident angle of the vapor deposition particles 17 with respect to the film formation substrate 40. A positional shift S of the vapor deposition pattern from an end of the opening 31 of the vapor deposition mask 30 can be expressed as follows where θ is the incident angle.

$$S = D_g \times \tan \theta \quad \text{(formula 6)}$$

Similarly, a positional shift $S_R$ which is obtained in a case where the incident angle is $\theta_R$ can be expressed as follows.

$$S_R = D_g \times \tan \theta_R \quad \text{(formula 7)}$$

As is clear from the formulas 6 and 7, a change in incident angle causes a change in amount of positional shift of the pattern. As described above, misalignment of the injection hole 16 causes a change in incident angle of the vapor deposition particles 17. Accordingly, the smaller the misalignment of the injection hole 16 is, the smaller the amount of change in positional shift of the vapor-deposited film pattern formed on the film formation substrate 40.

In a case where a pixel 2 of the organic EL display device 3 is designed, it is necessary to have a design margin in consideration of the amounts of change as shown in the formulas 6 and 7, in order that the luminescent layers 47 or the like are formed in luminescent regions of the pixel 2 even if the above-described change in amount of positional shift of the vapor-deposited film.

Note that it is possible to have a large design margin by increasing a width of a non-luminescent region. However, increasing the width of the non-luminescent region creates a necessity to reduce an area of the luminescent region, and thus prevents achieving high definition display.

In particular, a reduction in area of the luminescent region (i) accelerates degradation of emission lifetime and (ii) gives a dotted appearance to a displayed image. This lowers display quality of the organic EL display device 3.

In a case where, for example, $D_g=3$ mm and, as described above, $H_{sa}=80$ mm and W=10 mm, a positional shift of the vapor-deposited film near the end, on the right hand side, of the range of vapor deposition carried out with respect to the film formation substrate 40 is approximately as follows.

$$S=D_g \times \tan \theta = D_g \times W/H_{sa} = 375 \text{ μm}$$

$$S_R=D_g \times \tan \theta_R = D_g \times (W+\Delta x)/H_{sa} = 488 \text{ μm}$$

There is thus a positional shift of 100 μm or more.

In a normal organic EL display device 3, a distance (non-luminescent region) between each adjacent ones of the sub-pixels 2R, 2G, and 2B is several tens of micrometers. As such, in a case where the luminescent layers 47R, 47G, and 47B are misaligned by 100 μm or more, the luminescent layers 47R, 47G, and 47B are completely misaligned relative to the desired sub-pixels 2R, 2G, and 2B.

On the other hand, it is possible to reduce Δx by using the nozzle 13 in accordance with the present embodiment. This allows (i) a reduction in design margin of the organic EL display device 3, (ii) an increase in area of the luminescent region, and (iii) an increase in display definition.

Further, depending on an incident angle of the vapor deposition particles 17 with respect to the film formation substrate 40, it is also necessary to take account of a thickness of the vapor deposition mask 30 (e.g., a left end of the vapor deposition particles 17 illustrated in FIG. 10). In this case, $D_g$ in the formulas 6 and 7 is replaced with [$D_g$+[a thickness of the vapor deposition mask 30]]. However, in a case where the thickness of the vapor deposition mask 30 is sufficiently smaller than $D_g$, the thickness can be ignored.

(Design Example of Nozzle 13)

Next, the flowing description will describe a specific design example of the nozzle 13. Note that numerical values shown below are examples for configuring the nozzle 13.

The nozzles 13 and 113 are made of SUS304 (linear expansion coefficient: approximately $17 \times 10^{-6}$/° C.).

The conventional nozzle 113 illustrated in (a) and (b) of FIG. 7 has a nozzle length (L), along a longer side thereof, of 654 mm, and has the injection holes 116 which are arranged at a pitch of 20 mm. The number of the injection holes 116 is 33. Injection holes 116 at both ends of the nozzle 113 are located away from the respective both ends by 7 mm. An injection hole 116 at a center of the nozzle 113 is located away from each of the injection holes 116 at the both ends by 320 mm.

Next, the nozzle 13 in accordance with the present embodiment is arranged such that each of the blocks 15 has a length (a length of a block 15, Ls) of 214 mm, and eleven injection holes 16 are formed in each of the blocks 15.

Injection holes 16 at both ends of each of the blocks 15 are located away from the respective both ends by 7 mm. The blocks 15 are separated away from each other by 6 mm. Since the number of the blocks 15 is three, an overall length L of the nozzle 13 is 654 mm, which is equal to the nozzle length L of the conventional nozzle 113.

An injection hole 16 at a center of each of the blocks 15 is located away from each of the injection holes 16 at the both ends of the each of the blocks 15 by 100 mm.

According to the above arrangements, the injection holes 116 of the nozzle 113 coincide with the injection holes 16 of the nozzle 13 at normal temperature (25° C.). A case is considered here that the nozzles 113 and 13 in this state are heated to 280° C.

In the structure of the nozzle 113, an amount of extension ΔL' of a distance between the injection holes 116 at the both ends of the nozzle 113 is ΔL'=1.39 mm, according to the formula 1 where L is substituted by a distance between the injection holes 116 at the both ends.

By contrast, in the structure of the nozzle 13 in accordance with the present embodiment, an amount of extension of a distance between the injection holes 16 at the both ends of each of the blocks 15 is ΔLs'=0.43 mm, according to the formula 2 where Ls is substituted by a distance between the injection holes 16 at the both ends. This shows that the structure of the nozzle 13 improves misalignment of the injection holes 16 before and after heating, as compared with the nozzle 113.

(Modified Examples of Nozzle 13)

Next, the following description will discuss modified examples of the nozzle 13 with reference to FIGS. 11 through 13. The nozzle 13 may have structures as illustrated in FIGS. 11 through 13.

FIG. 11 is a plan view illustrating an arrangement of a nozzle including a plurality of blocks each having a parallelogram shape in a plan view.

A nozzle 13 illustrated in FIG. 11 includes a plurality of blocks 15b each having a parallelogram shape in a plan view, in place of the blocks 15 each having a rectangular shape in a plan view. The nozzle 13 illustrated in FIG. 11 is similar in shape to the nozzle 13 described with reference to FIG. 1 etc., except for the above difference. Note that, although two blocks 15b are illustrated in FIG. 11, the number of the blocks 15b may be three or more.

Although not shown in FIG. 11, each of the blocks 15b covers a protruding section 14a which has a parallelogram shape in a plan view. Gaps 19 are provided between the respective plurality of blocks 15b.

As in the case of the nozzle 13 illustrated in FIG. 11, in a case where (i) the blocks 15b are divided parallelograms in a plan view and (ii) the blocks 15b extend by heat so as to collide against each other, opposite forces in a Y direction (arrows B and C in FIG. 11) are applied between end sections that collide against each other. As such, forces pushing each other between the end sections of the blocks 15b colliding against each other are each converted into a rotation direction (in a direction of an arrow D of FIG. 11).

This allows misalignment of the injection holes 16 in a length direction (X direction) of the nozzle 13 to be partially converted into a short-side direction (Y direction) perpendicular to the length direction. This makes it possible to suppress misalignment of the injection holes 16 in the length direction.

The short-side direction of the nozzle 13 is parallel to the scanning direction (a direction indicated by an arrow A in FIG. 11) of the film formation substrate 40. The film formation substrate 40 is scanned in the direction of the arrow A during the vapor deposition treatment. As such, even in a case where misalignment of the injection holes 16 occurs in the direction of the arrow A, influence of misalignment of the vapor-deposited film pattern is small and therefore does not cause a big problem.

Further, as illustrated in FIG. 11, a direction along which the injection holes 16 of each of the blocks 15b are arranged is misaligned from the X direction toward the scanning direction of the film formation substrate 40. That is, the injection holes 16 of each of the blocks 15b are arranged so that the direction along which the injection holes 16 are arranged is inclined so as to approximate, from a direction parallel to the length direction of the each of the blocks 15b, a direction along (parallel to) a diagonal line connecting the acute angles of the parallelogram.

Accordingly, the plurality of blocks 15b each having a parallelogram shape can also have such an arrangement of the injection holes 16 that the pitch between the injection holes 16 is equal over the plurality of blocks 15b in the X direction.

Each of the blocks of the nozzle 13 may have a triangular shape or a trapezoidal shape in a plan view.

(a) of FIG. 12 is a plan view illustrating an arrangement of the nozzle 13 including the a plurality of blocks 15c each having a triangular shape in a plan view. (b) of FIG. 12 is a plan view illustrating an arrangement of the nozzle 13 a plurality of blocks 15c each having a trapezoidal shape in a plan view.

A nozzle 13 illustrated in (a) of FIG. 12 includes a plurality of blocks 15c each having a triangular shape in a plan view, in place of the blocks 15 each having a rectangular shape in a plan view. The nozzle 13 illustrated in (a) of FIG. 12 is similar in shape to the nozzle 13 described with reference to FIG. 1 etc., except for the above difference. Note that although (a) of FIG. 12 illustrates twelve blocks 15c, the number of the blocks 15c is not limited to the number illustrated in (a) of FIG. 12, and may be 11 or smaller, or may be 13 or greater.

Although not shown in (a) of FIG. 12, the blocks 15c respectively cover a plurality of protruding sections 14a each having a triangular shape in a plan view. Gaps 19 are provided between the respective plurality of blocks 15c.

Each of the plurality of blocks 15c faces in a reverse direction to a direction in which an adjacent block 15c faces. That is, the plurality of blocks 15c are arranged along an X direction so as to face in alternate directions.

In a case where blocks have a triangular shape in a plan view like the blocks 15c, misalignment of the injection holes 16 in a long direction (X direction) of the nozzle 13 is partially converted into a direction parallel to the scanning direction (a direction indicated by an arrow A in (a) of FIG. 12) of the film formation substrate 40, as in the case of blocks each having a parallelogram shape in a plan view.

However, unlike the case of the blocks each having a parallelogram shape, misalignment of each of the blocks 15c is not changed into misalignment in a rotation direction, but is instead shifted toward directions (directions indicated by arrows E and F in (a) of FIG. 12) parallel to the scanning direction of the film formation substrate 40.

As such, even in a case where misalignment of the injection holes 16 occurs, there is little influence of misalignment of the vapor-deposited film pattern.

In the nozzle 13 illustrated in (a) of FIG. 12, each of the blocks 15c has a single injection hole 16. As such, a pitch between the injection holes 16 in the X direction is equal over the plurality of blocks 15c.

Note that, although (a) of FIG. 12 shows a single injection hole 16 per block 15c, the present modified example is not limited to this. A plurality of injection holes 16 may be formed in each of the blocks 15c. A larger number of divisions of the blocks 15c allows a greater improvement in misalignment of the injection holes 16, but requires more processing of the blocks 15c. The number of the divisions of the blocks 15c may therefore be adjusted appropriately.

As described above, the plurality of blocks 15b illustrated in FIG. 11 and the plurality of blocks 15c illustrated in (a) of FIG. 12 each have such a shape that causes the plurality of blocks 15b or 15c to push each other so as to be misaligned in the Y direction when the plurality of blocks 15b or 15c are heated. As such, even in a case where the plurality of blocks 15b or 15c are heated to expand so as to push each other, the plurality of blocks 15b or 15c are misaligned in the Y direction, which is the scanning direction of the film formation substrate 40. This makes it possible to suppress production of a defective product.

The blocks 15c each having a triangular shape as illustrated in (a) of FIG. 12 may have a trapezoidal shape in which a corner facing the scanning direction (the direction indicated by an arrow A) is removed, as illustrated in (b) of FIG. 12.

As illustrated in (b) of FIG. 12, blocks 15c, each having a trapezoidal shape, are arranged linearly so as to face in alternate directions while having a gap 19 provided between each adjacent ones of the blocks 15c. Accordingly, as in the case with the blocks each having a triangular shape, even in a case where the plurality of blocks 15c are heated to expand so as to push each other, the plurality of blocks 15c are misaligned in the Y direction, which is the scanning direction of the film formation substrate 40. This makes it possible to suppress production of a defective product.

FIG. 13 is a perspective view illustrating a nozzle constituted by (i) a nozzle main body including no protruding section and (ii) a plurality of blocks.

A nozzle 13 illustrated in FIG. 13 includes a nozzle main body 14d, a plurality of blocks 15, and a plurality of shielding plates 18.

The nozzle main body 14d does not have a protruding section 14a unlike the above-described nozzle main body 14. The nozzle main body 14d has such a recessed shape that an upper surface of the nozzle main body 14d is a single flat surface, throughout which an opening is formed. The plurality of blocks 15 are placed over the nozzle main body 14d so that (i) the plurality of blocks 15 cover the upper surface (the surface throughout which the opening is formed) of the nozzle main body 14d and (ii) the injection holes 16 are arranged at fixed intervals. The blocks 15 are not fixed to the nozzle main body 14d.

In the nozzle 13 illustrated in FIG. 13, a shielding plate 18 is provided so as to span across a gap between each adjacent ones of the blocks 15. The shielding plates 18 are thus provided so as to cover parts of gaps 19 between the respective plurality of blocks 15 which parts face the side on which the opening formed in the upper surface of the nozzle main body 14d is provided. This makes it possible to prevent vapor deposition particles leaking through the gaps 19 between the respective plurality of lids 15 from being injected toward the film formation substrate 40 provided above. Note that a plurality of nozzles 13, each of which is the nozzle 13 shown in FIG. 13, may be provided in parallel to each other.

Embodiment 2

Next, Second Embodiment of the present invention will be described below with reference to FIG. 14 through (a) and (b) of FIG. 16. For convenience, members that have functions identical to those illustrated in the drawings of First Embodiment are given identical reference numerals, and are not described repeatedly.

(Description of Arrangement of Nozzle 53)

FIG. 14 is a perspective view illustrating an arrangement of a vapor deposition source 50 in accordance with Second Embodiment. (a) and (b) of FIG. 15 illustrate blocks 55 of a nozzle 53 in accordance with Second Embodiment. (a) of FIG. 15 is a plan view illustrating the blocks 55 which have not been heated, and (b) is a plan view illustrating the blocks 55 which have been heated.

A vapor deposition device in accordance with Second Embodiment includes the vapor deposition source 50 in place of the vapor deposition source 10. The vapor deposition source 50 is different from the vapor deposition source 10 in that the vapor deposition source 50 includes the nozzle 53 in place of the nozzle 13. The vapor deposition source 50 is similar to the vapor deposition source 10 except for the above difference.

The nozzle 53 includes a nozzle main body 54 and the blocks 55. Each of the blocks 55 has a plurality of injection holes 16 arranged along an X direction.

The nozzle main body 54 is constituted by (i) a plurality of protruding sections 54a, each of which protrudes toward the film formation substrate 40 and has openings 54c formed on one surface of the each of the plurality of protruding sections 54a and (ii) a connection section 54b which connects the plurality of protruding sections 14a with one another. The nozzle main body 54 has a container shape (recessed shape) in which an upper surface of each of the plurality of protruding sections 14a has an opening.

The plurality of protruding sections 54a are formed integrally with the connection section 54b. The plurality of blocks 55 cover the respective plurality of protruding sections 14a.

The blocks 55 are not fixed to the protruding sections 54a. Extension of the protruding sections 54a caused by heat and extension of the lids 55 caused by heat are independent of each other.

One end of the inlet tube 12 is connected with a side surface of the nozzle main body 54. A vapor deposition material supplied from the vapor deposition material supply source 11 connected with the other end of the inlet tube 12 flows through the inlet tube 12 into the connection section 54b, and is then supplied to the protruding sections 54a (i.e., the blocks 55).

Like the nozzle 13, the nozzle 53 includes the three divided blocks 55.

The three blocks 55 of the nozzle 53 are arranged so as not to interfere with one another.

That is, as illustrated in (a) of FIG. 15, length directions of the respective three blocks 55 are parallel to one another, and a block 55 that is provided in the middle among the three blocks 55 is misaligned from the other ones of the three blocks 55 in a Y direction.

The blocks 55 are sufficiently spaced apart from each other in the scanning direction (Y direction) of the film formation substrate 40.

Before the nozzle 53 is heated, the plurality of injection holes 16 are arranged so that a pitch between the plurality of injection holes 16 in the X direction is equal over a plurality of nozzles 53a.

As illustrated in (b) of FIG. 15, when the nozzle 53 is heated, each of the blocks 55 extends, particularly in the length direction ($\pm$X direction) thereof. However, in the nozzle 53, the block 55 in the middle among the three blocks 55 which are arranged parallel to one another is misaligned from the other ones of the three blocks 55 in the scanning direction of the film formation substrate 40. Further, sufficient spaces are provided between the respective blocks 55 in the scanning direction of the film formation substrate.

As such, even in a case where each of the blocks 55 extends by heat in the length direction thereof, end sections of the blocks 55 do not interfere with one another. This makes it possible to prevent misalignment of the injection holes 16 caused by interference.

In the nozzle 13 described above, interference among the blocks 15 which is caused in a case where the blocks 15 extend by heat in the length direction is prevented by providing gaps 19 between the respective blocks 15.

However, in the nozzle 13, a distance of a gap 19 needs to be smaller than a distance between the injection holes 16 in order for the pitch between the injection holes 16 to be equal over the plurality of blocks 15 arranged in a row. As such, the nozzle 13 needs to be designed so that an amount of extension, caused by heat, in the length direction of the block 15 is equal to or smaller than an interval between the injection holes 16.

By contrast, in the nozzle 53, the blocks 55 are provided parallel to one another, but the block 55 in the middle is misaligned from the other ones of the blocks 55 in the scanning direction of the film formation substrate 40. As such, it is not necessary that an amount of extension, caused by heat, of each of the blocks 55 in the length direction be smaller than an interval between the injection holes 16. This makes it possible to improve flexibility in design.

Further, it is possible to increase, in each of the blocks 55, a distance between an end section and an injection hole 16 located the closest to the end section, in addition to making the pitch between the injection holes 16 equal over the plurality of blocks 55.

Note, here, that both end sections, in the length direction, of each of the blocks 55 are each different in shape from a central section of each of the blocks 55. As such, there tends to be a temperature distribution between (i) injection holes 16 that are formed near both ends of each of the blocks 55 among the plurality of injection holes 16 and (ii) an injection hole 16 that is formed near the central section among the plurality of injection holes 16. The temperature distribution causes a change in amount of the vapor deposition material to be injected. This causes a film thickness of a vapor-deposited film formed to have an uneven film thickness.

However, in the nozzle 53, the block 55 in the middle is misaligned from the other ones of the blocks 55 in the scanning direction of the film formation substrate 40, as described above.

This makes it possible to increase, in each of the blocks 55, a distance between (i) each of the both end sections and (ii) the injection hole 16 that is located the closest to the each of the both end sections, while making the pitch between the injection holes 16 equal over the plurality of blocks 55. This makes it possible to (i) prevent a variation in temperatures of the injection holes 16 in each of the blocks 55 to thereby suppress a variation in amounts of the vapor deposition particles 17 injected and (ii) improve workability.

In the nozzle 53, only one of the three blocks 55 is misaligned from the other ones of the three blocks 55 in the scanning direction of the film formation substrate 40. Note, however, that the present embodiment is not limited to this. It is only necessary that at least one of the plurality of blocks 55 is misaligned from the other one(s) of the plurality of blocks 55 in the scanning direction of the film formation substrate 40. More than one of the plurality of blocks 55 may be misaligned from the other one(s) of the plurality of blocks 55 in the scanning direction of the film formation substrate 40.

(Modified Examples of Vapor Deposition Source 50)

(a) and (b) of FIG. 16 illustrate modified examples of the vapor deposition source 50. (a) of FIG. 16 is a view illustrating an arrangement of a vapor deposition source 50 in which a single vapor deposition material supply source 11 is connected with a plurality of divided nozzles 53a. (b) of FIG. 16 is a view illustrating an arrangement of a vapor deposition source 50 in which a plurality of vapor deposition material supply sources 11 are connected with the respective plurality of divided nozzles 13a.

A nozzle 53 of the vapor deposition source 50 illustrated in (a) of FIG. 16 is obtained by dividing the nozzle 53 illustrated in FIG. 14 into three. The nozzle 53 illustrated in (a) of FIG. 16 is constituted by three nozzles 53a. That is, a nozzle main body of each of the nozzles 53a is obtained by separating the protruding sections 54a for each of the openings 54c of the nozzle 53 illustrated in (a) of FIG. 16.

Each of the nozzles 53a is constituted by (i) a nozzle main body 53b and (ii) a block 53c which covers an opening formed in an upper surface of the nozzle main body 53b. Each of the nozzle main bodies 53b has a container shape (recessed shape) in which an opening is formed in an upper surface of the each of the nozzle main bodies 53b. Each of the blocks 53c is a lid which covers the opening formed in the upper surface of a corresponding one of the nozzle main bodies 53b, and is not fixed to the corresponding one of the nozzle main bodies 53b. The blocks 53c are separated from one another.

One end of the inlet tube 12 diverges into three parts, which are connected with side surfaces of the nozzle main bodies 53b of the respective nozzles 53a. The other end of the inlet tube 12 is connected with a single vapor deposition material supply source 11.

As described above, the nozzles 53a illustrated in (a) of FIG. 16 have such a structure that the nozzle 53 is divided into the nozzles 53a.

The vapor deposition source 50 illustrated in (b) of FIG. 16 (a) is obtained by further separating each of (i) the inlet tube 12 and (ii) the vapor deposition material supply source into three parts in the vapor deposition source 50 illustrated in (a) of FIG. 16.

The vapor deposition source 50 illustrated in (b) of FIG. 16 includes the nozzle 53 constituted by the three nozzles 53a, and further includes the inlet tube 12 and the vapor deposition material supply source 11, each of which is divided into three parts. The nozzles 53a are separately connected with the respective vapor deposition material supply sources 11 via the respective inlet tubes 12.

The vapor deposition source 50 illustrated in (b) of FIG. 16 is thus constituted by the separated three vapor deposition material supply sources 11.

As illustrated in (a) and (b) of FIG. 16, completely separating the nozzles 53a from one another and individually connecting the nozzles 53a with the respective vapor deposition material supply sources 11 eliminates the need to prepare a long integrated nozzle, and thus eliminates the need to carry out high-precision processing of openings for a long distance. This makes it possible to suppress production of a defective product, and thus prevent an increase in production cost.

The vapor deposition source 50 illustrated in (a) of FIG. 16 has a single vapor deposition material supply source 11, and the inlet tube 12 connected with the nozzles 53a is branched. As such, according to the vapor deposition source 50, there is a possibility that amounts and a distribution of the vapor deposition particles injected from the respective nozzles 53a may be affected by lengths and shapes of parts of the inlet tube 12 which parts connect the respective nozzles 53a with the vapor deposition material supply source 11.

By contrast, in the vapor deposition source 50 illustrated in (b) of FIG. 16, the vapor deposition material supply source 11 is also divided into three vapor deposition material supply sources 11, which are separately connected with the respective nozzles 53a via the respective inlet tubes 12. This makes it easy for the vapor deposition material supply sources 11 to have an identical shape, and thus makes it possible to prevent lengths and shapes of the inlet tubes 12 from affecting an amount and a distribution of the vapor deposition particles injected from the nozzles 53a.

However, since the vapor deposition material supply sources 11 of the vapor deposition source 50 illustrated in (b) of FIG. 16 are separated from one another, there is a possibility that, in a case where a variation in flow rates of the vapor deposition particles supplied from the respective vapor deposition sources 50, amounts and a distribution of the vapor deposition particles injected from the respective nozzles 53a are affected by the variation.

By contrast, the vapor deposition source 50 illustrated in (a) of FIG. 16 includes a single vapor deposition material supply source 11 and therefore makes it possible to prevent a variation in the vapor deposition particles supplied from the vapor deposition material supply source 11.

As described above, the vapor deposition sources 50 illustrated in (a) and (b) of FIG. 16 have respective different structures for supplying the vapor deposition particles to the nozzles 53a, and therefore have respective different factors that affect amounts and a distribution of the vapor deposition particles injected from the nozzles 53a. It is therefore necessary to use the vapor deposition sources 50 illustrated in (a) and (b) of FIG. 16 properly in view of the above.

The present invention is not limited to the above-described embodiments but allows various modifications within the scope of the claims. Any embodiment derived from an appropriate combination of the technical means disclosed in the different embodiments will also be included in the technical scope of the present invention.

In order to achieve the object, a vapor deposition device of the present invention is a vapor deposition device for performing a vapor deposition treatment so as to form a vapor-deposited film having a predetermined pattern on a film formation substrate, including: an injection section having a plurality of injection holes from which vapor deposition particles are injected toward the film formation substrate when the vapor deposition treatment is carried out, the vapor deposition particles constituting the vapor-deposited film; and a plurality of control plates for restricting an incident angle, with respect to the film formation substrate, of the vapor deposition particles injected from the plurality of injection holes, the plurality of control plates being provided between the injection section and the film formation substrate, the injection section including (i) an injection section main body in a container shape, the injection section main body having at least one opening on a surface, on a film formation substrate side, of the injection section main body and (ii) a plurality of blocks which cover the at least one opening and are separated from each other, each of the plurality of blocks having the plurality of injection holes.

According to the arrangement, the incident angle, with respect to the film formation substrate, of the vapor deposition particles injected from the injection holes can be restricted to a certain range with use of the plurality of control plates provided between the injection section and the film formation substrate. This makes it possible to prevent the vapor deposition particles from flying orthogonally onto the film formation substrate. Accordingly, it is possible to prevent unnecessary adhesion of a vapor-deposited film onto a side section of the predetermined vapor deposition pattern. This makes it possible to form a vapor-deposited film pattern with high definition.

Further, according to the arrangement, (i) the plurality of injection holes are formed in each of the plurality of blocks, which cover the at least one opening of the injection section main body and are provided separately from the injection section main body, and the plurality of blocks are separated from one another.

Accordingly, in a case where the plurality of blocks are heated when the vapor deposition treatment is carried out, the plurality of blocks extend independently of each other. This makes it possible to reduce misalignment of the plurality of injection holes before and after the heating as compared with a case where a single long block is formed integrally with the injection main body.

This makes it possible to suppress occurrence of misalignment between (i) each of the plurality of control plates and (ii) a corresponding one of the plurality of injection holes during heating. This allows a higher-definition pattern of the vapor-deposited film pattern to be formed on the film formation substrate.

The vapor deposition device is preferably arranged such that the injection section main body is not fixed to the plurality of blocks. According to this arrangement, even in a case where the injection main body expands with heat due to the heating carried out at the time of a vapor deposition treatment, it is possible to suppress an effect which the thermal expansion of the injection main body has on the plurality of blocks. This makes it possible to further suppress misalignment of the plurality of injection holes before and after the heating.

The vapor deposition device is preferably arranged such that the at least one opening of the injection section main body is a plurality of openings; and the plurality of blocks cover the respective plurality of openings the injection section main body. This arrangement allows the vapor deposition particles in the injection section main body to be injected from the plurality of injection holes toward the film formation substrate.

The vapor deposition device is preferably arranged such that the injection section main body includes a plurality of protruding sections which cause the respective plurality of openings to protrude toward the film formation substrate; and the plurality of blocks cover the respective plurality of protruding sections.

According to the arrangement, the plurality of blocks cover the respective plurality of protruding sections. As such, even in a case where the vapor deposition particles leak through the openings other than the injection holes, it is possible to prevent the leaked vapor deposition particles from reaching the film formation substrate.

The vapor deposition device may be arranged such that the injection section main body is divided into a plurality of injection section main bodies for the respective plurality of openings. This arrangement eliminates the need to prepare a long integrated injection section, and thus eliminates the need to carry out high-precision processing of openings for a long distance. This makes it possible to suppress production of a defective product, and thus prevent an increase in production cost.

It is preferable that the vapor deposition device further include a substrate driving section for scanning the film formation substrate in one direction, which is a first direction, the plurality of injection holes of each of the plurality of blocks being arranged at an equal pitch in a second direction perpendicular to the first direction in a plan view when the plurality of blocks are not heated.

According to this arrangement, it is possible to form a vapor deposition pattern onto the film formation substrate while scanning the film formation substrate in the first direction. This allows a vapor deposition mask to be smaller than the film formation substrate.

Accordingly, it becomes possible to prevent bending of the vapor deposition mask, and thus form a vapor deposition pattern with high definition.

The vapor deposition device may be arranged such that each of the plurality of blocks has such a shape that, when the plurality of blocks are heated, the plurality of blocks push each other so as to be misaligned in the first direction. According to this arrangement, even in a case where the plurality of blocks are heated to expand so as to push each other, the plurality of blocks are misaligned in the first direction, which is the scanning direction of the film formation substrate. This makes it possible to suppress production of a defective product.

The vapor deposition device may be arranged such that each of the plurality of blocks has a parallelogram shape in a plan view. The vapor deposition device may be arranged such that each of the plurality of blocks has a triangular or trapezoidal shape in a plan view, and faces in a direction reverse to a direction in which an adjacent one of the plurality of blocks faces.

According to this arrangement, even in a case where the plurality of blocks are heated to expand so as to push each other, the plurality of blocks are misaligned in the first direction, which is the scanning direction of the film formation substrate. This makes it possible to suppress production of a defective product.

In a case where each of the plurality of blocks has a parallelogram shape in a plan view, it is preferable that the plurality of injection holes of each of the plurality of blocks are arranged so that a straight line connecting the plurality of injection holes is inclined so as to approximate, from a direction parallel to a length direction of the each of the plurality of blocks, a direction along a diagonal line connecting acute angles of the parallelogram shape.

This allows the plurality of blocks each having a parallelogram shape to also have such an arrangement of the injection holes that the pitch between the injection holes is equal over the plurality of blocks in the second direction.

The vapor deposition device is preferably arranged such that the plurality of blocks are arranged in a row in the second direction so that the length directions of the respective plurality of blocks are parallel to each other.

According to this arrangement, the plurality of injection holes can be arranged continuously along the second direction for a long distance. Accordingly, it becomes possible to increase an area in which a vapor-deposited film pattern can be formed per scanning of the film formation substrate, and thus reduce time for production.

The vapor deposition device is preferably arranged such that the length directions of the respective plurality of blocks are parallel to each other, and at least one of the plurality of blocks is misaligned from the other one(s) of the plurality of blocks in the first direction.

According to this arrangement, it is possible to prevent the plurality of blocks to interfere with each other even in a case where the plurality of blocks extend by heat in the length direction. This makes it possible to suppress misalignment of the injection holes before and after the heating.

The vapor deposition device is preferably arranged such that the pitch between the plurality of injection holes is equal over the plurality of blocks in the second direction when the plurality of blocks are not heated. This makes it possible to prevent misalignment between vapor-deposited film patterns corresponding to the respective blocks.

The vapor deposition device is preferably arranged such that each of the plurality of blocks is made of an inver material. This makes it possible to suppress misalignment of the injection holes before and after the heating.

In order to achieve the object, a vapor deposition method of the present invention is a vapor deposition method for performing a vapor deposition treatment so as to form a vapor-deposited film having a predetermined pattern on a film formation substrate, the vapor deposition method comprising the step of: injecting, when the vapor deposition treatment is carried out, vapor deposition particles so that the vapor deposition particles (i) pass through between a plurality of control plates for restricting an incident angle, with respect to the film formation substrate, of the vapor deposition particles and (ii) then reach the film formation substrate, the vapor deposition particles constituting the vapor-deposited film pattern, the vapor deposition particles being injected from a plurality of injection holes, which are formed in each of a plurality of blocks separated from each other, in the step of injecting the vapor deposition particles.

According to the arrangement, when the vapor deposition particles reach the film formation substrate, an incident angle of the vapor deposition particles with respect to the film formation substrate is restricted by the control plates within a certain range. This makes it possible to prevent the vapor deposition particles from flying orthogonally onto the film formation substrate. Accordingly, it is possible to prevent unnecessary adhesion of a vapor-deposited film onto a side section of a predetermined vapor deposition pattern deposited onto the film formation substrate. This makes it possible to form a vapor-deposited film pattern with higher definition.

Further, in the step of injecting the vapor deposition particles, the vapor deposition particles are injected from the plurality of injection holes which are formed in each of the plurality of blocks separated from each other.

Accordingly, since the plurality of blocks extend independently of one another in a case where the plurality of blocks are heated during the vapor deposition treatment, it is possible to reduce misalignment of the plurality of injection holes before and after the heating, as compared with a case where a single long block is integrally formed.

This makes it possible to prevent occurrence of misalignment between (i) each of the plurality of control plates and (ii) a corresponding one of the plurality of injection holes during heating. This allows a vapor-deposited film pattern to be formed with higher definition on the film formation substrate.

It is preferable to manufacture an organic EL display device by depositing a luminescent layer for each sub-pixel by the vapor deposition method. This makes it possible to obtain an organic EL display device in which a high-definition pattern of a luminescent layer is formed as the vapor deposition pattern.

INDUSTRIAL APPLICABILITY

The present invention is applicable to a vapor deposition device and a vapor deposition method for forming a vapor-deposited film in a device that requires formation of a vapor deposition pattern with high definition. In particular, the present invention can be suitably applied to a vapor deposition device and a vapor deposition method for carrying out vapor deposition of a luminescent layer in an organic EL display device.

REFERENCE SIGNS LIST

1: vapor deposition device
2: pixel
3: organic EL display device
9: substrate driving mechanism (substrate driving section)
10 and 50: vapor deposition source
11: vapor deposition material supply source
12: inlet tube
13 and 53: nozzle (injection section)
14, 14d, and 54: nozzle main body (injection section main body)
14a and 54a: protruding section
14b and 54b: connection section
14c and 54c: opening
15 and 55: block
15b and 15c: block
16: injection hole
17: vapor deposition particles
19: gap
20: control plate
30: vapor deposition mask
31: opening
40: film formation substrate
47: luminescent layer

The invention claimed is:
1. A vapor deposition device for performing a vapor deposition treatment so as to form a predetermined vapor-deposited film pattern on a film formation substrate, comprising:
an injection section having a plurality of injection holes from which vapor deposition particles are injected toward the film formation substrate when the vapor deposition treatment is carried out, the vapor deposition particles constituting the vapor-deposited film pattern;
a plurality of control plates for restricting an incident angle, with respect to the film formation substrate, of the vapor deposition particles injected from the plurality of injection holes, the plurality of control plates being provided between the injection section and the film formation substrate; and
a substrate driving section for scanning the film formation substrate in one direction, which is a first direction,
the injection section including (i) an injection section main body in a container shape, the injection section main body having a plurality of openings on a surface, on a film formation substrate side, of the injection section main body and (ii) a plurality of blocks which are separated from each other, each of the plurality of blocks having the plurality of injection holes, the injection section main body including (i) a plurality of protruding sections which cause the respective plurality of openings to protrude toward the film formation substrate and (ii) a connection section which connects the plurality of protruding sections, the plurality of protruding sections and the connection section being provided integrally with each other, the plurality of blocks covering the plurality of respective openings and the plurality of respective protruding sections, the plurality of injection holes of each of the plurality of blocks being arranged at an equal pitch in a second direction perpendicular to the first direction in a plan view when the plurality of blocks are not heated, the pitch between the plurality of injection holes being equal over the plurality of blocks in the second direction when the plurality of blocks are not heated, at least one of the plurality of injection holes being provided between two of the plurality of control plates in a plan view, at least one of the plurality of blocks being separated from the film formation substrate by the plurality of control plates, each of the plurality of blocks has such a shape that, when the plurality of blocks are heated, the plurality of blocks directly push each other, the plurality of injection holes being provided through each of the plurality of blocks from an opening side to the film formation substrate side, and a surface of each of the plurality of blocks on which surface the plurality of injection holes are provided is flat.

2. The vapor deposition device as set forth in claim 1, wherein:

the injection section main body is not fixed to the plurality of blocks.

3. The vapor deposition device as set forth in claim 1, wherein:

the injection section main body is divided into a plurality of injection section main bodies for the respective plurality of openings.

4. The vapor deposition device as set forth in claim 1, wherein:

the plurality of blocks push each other so as to be misaligned in the first direction.

5. The vapor deposition device as set forth in claim 4, wherein:

each of the plurality of blocks has a parallelogram shape in a plan view.

6. The vapor deposition device as set forth in claim 5, wherein:

the plurality of injection holes of each of the plurality of blocks are arranged so that a straight line connecting the plurality of injection holes is inclined, from a direction parallel to a length direction of the each of the plurality of blocks, in a direction along a diagonal line connecting acute angles of the parallelogram shape.

7. The vapor deposition device as set forth in claim 4, wherein:

each of the plurality of blocks has a triangular or trapezoidal shape in a plan view, and faces in a direction reverse to a direction in which an adjacent one of the plurality of blocks faces.

8. The vapor deposition device as set forth in claim 1, wherein:

the plurality of blocks are arranged in a row in the second direction so that the length directions of the respective plurality of blocks are parallel to each other.

9. The vapor deposition device as set forth in claim 1, wherein:

each of the plurality of blocks is made of an inver material.

10. A method for producing an organic EL display device, comprising using a vapor deposition device for performing a vapor deposition treatment so as to form a predetermined vapor-deposited film pattern on a film formation substrate, said vapor deposition device including:

an injection section having a plurality of injection holes from which vapor deposition particles are injected toward the film formation substrate when the vapor deposition treatment is carried out, the vapor deposition particles constituting the vapor-deposited film pattern;

a plurality of control plates for restricting an incident angle, with respect to the film formation substrate, of the vapor deposition particles injected from the plurality of injection holes, the plurality of control plates being provided between the injection section and the film formation substrate; and a substrate driving section for scanning the film formation substrate in one direction, which is a first direction, the injection section including (i) an injection section main body in a container shape, the injection section main body having a plurality of openings on a surface, on a film formation substrate side, of the injection section main body and (ii) a plurality of blocks which are separated from each other, each of the plurality of blocks having the plurality of injection holes, the injection section main body including (i) a plurality of protruding sections which cause the respective plurality of openings to protrude toward the film formation substrate and (ii) a connection section which connects the plurality of protruding sections, the plurality of protruding sections and the connection section being provided integrally with each other, the plurality of blocks covering the plurality of respective openings and the plurality of respective protruding sections, the plurality of injection holes of each of the plurality of blocks being arranged at an equal pitch in a second direction perpendicular to the first direction in a plan view when the plurality of blocks are not heated, the pitch between the plurality of injection holes being equal over the plurality of blocks in the second direction when the plurality of blocks are not heated, at least one of the plurality of injection holes being provided between two of the plurality of control plates in a plan view, at least one of the plurality of blocks being separated from the film formation substrate by the plurality of control plates, each of the plurality of blocks has such a shape that, when the plurality of blocks are heated, the plurality of blocks directly push each other, the plurality of injection holes being provided through each of the plurality of blocks from an opening side to the film formation substrate side, and a surface of each of the plurality of blocks on which surface the plurality of injection holes are provided is flat.

11. The method as set forth in claim 10, comprising depositing a luminescent layer for each sub-pixel by the vapor deposition device.

12. A vapor deposition device for performing a vapor deposition treatment so as to form a predetermined vapor-deposited film pattern on a film formation substrate, comprising:

an injection section having a plurality of injection holes from which vapor deposition particles are injected toward the film formation substrate when the vapor deposition treatment is carried out, the vapor deposition particles constituting the vapor-deposited film pattern; and a plurality of control plates for restricting an incident angle, with respect to the film formation substrate, of the vapor deposition particles injected from the plurality of injection holes, the plurality of control plates being provided between the injection section and the film formation substrate, the injection section including (i) an injection section main body in a container shape, the injection section main body having a plurality of openings on a surface, on a film formation substrate side, of the injection section main body, (ii) a plurality of blocks which are separated from each other, each of the plurality of blocks having the plurality of injection holes, and (iii) a substrate driving section for scanning the film formation substrate in one direction, which is a first direction, the injection section main body including (i) a plurality of protruding sections which cause the respective plurality of openings to protrude toward the film formation substrate and (ii) a connection section which connects the plurality of protruding sections, the plurality of protruding sections and the connection section being provided integrally with each other, the plurality of blocks covering the plurality of respective openings and the plurality of respective protruding sections, the plurality of injection holes of each of the plurality of blocks being arranged at an equal pitch in a second direction perpendicular to the first direction in a plan view when the plurality of blocks are not heated, at least one of the plurality of injection holes being provided between two of the plurality of control plates in a plan view, at least one of the plurality of blocks being separated from the film formation substrate by the plurality of control plates, each of the plurality of blocks has such a shape that, when the plurality of blocks are heated, the plurality of blocks directly push each other, the plurality of injection holes being provided through each of the plurality of blocks from an opening side to the film formation substrate side, a surface of each of the plurality of blocks on which surface the plurality of injection holes are provided is flat.

13. The vapor deposition device as set forth in claim 12, wherein:

the plurality of blocks are arranged in a row in the second direction so that the length directions of the respective plurality of blocks are parallel to each other.

14. A method for producing an organic EL display device, comprising using a vapor deposition device recited in claim 12.

15. A method for manufacturing an organic EL display device, comprising depositing a luminescent layer for each sub-pixel by a vapor deposition method recited in claim 14.

* * * * *